(12) United States Patent
Lee et al.

(10) Patent No.: US 6,214,423 B1
(45) Date of Patent: Apr. 10, 2001

(54) METHOD OF FORMING A POLYMER ON A SURFACE

(75) Inventors: Wei William Lee, Plano; Richard B. Timmons, Arlington, both of TX (US); Licheng Marshal Han, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/292,629

(22) Filed: Apr. 15, 1999

Related U.S. Application Data

(60) Provisional application No. 60/082,028, filed on Apr. 16, 1998.

(51) Int. Cl.⁷ .................................................... C08F 2/46
(52) U.S. Cl. ...................... 427/492; 427/243; 427/255.6; 427/569
(58) Field of Search ................................ 427/488, 492, 427/569, 243, 255.6

(56) References Cited

U.S. PATENT DOCUMENTS

| 5,232,642 | * | 8/1993 | Kamo et al. .|
| 5,876,753 | * | 3/1999 | Timmons et al. . |
| 5,932,296 | * | 8/1999 | Sulka et al. . |

FOREIGN PATENT DOCUMENTS

| 62-55859 | * | 11/1987 | (JP) . |
| 363009907A | * | 1/1988 | (JP) . |

\* cited by examiner

*Primary Examiner*—Bernard Pianalto
(74) *Attorney, Agent, or Firm*—Carlton H. Hoel; W. James Brady; Frederick J. Telecky, Jr.

(57) ABSTRACT

Pulsed plasma deposition of polymers as dielectrics for integrated circuit interconnects fills minimal gaps and yields a porous polymer with thermal stability by plasma off times sufficiently long to dissipate plasma on time energy input plus an anneal of the deposited polymer to drive off occluded monomers and small oligomers.

4 Claims, 24 Drawing Sheets

1/5 ms ON/OFF PULSE

1/10 ms ON/OFF PULSE

1/20 ms ON/OFF PULSE

1/25 ms ON/OFF PULSE

1/30 ms ON/OFF PULSE

1/40 ms ON/OFF PULSE 200W, 1/40ms, 60MIN 50W, 1/40ms, 20MIN

METHOD OF FORMING A POLYMER ON A SURFACE

This application claims benefit of Provisional of appl. 60/082,028, filed Apr. 16, 1998.

The invention relates to electronic semiconductor devices, and, more particularly, to dielectric structures and fabrication methods for such structures.

The performance of high density integrated circuits is dominated by metal interconnect level RC time delays and adjacent crosstalk due to the resistivity of the metal lines and the capacitive coupling between adjacent lines. The capacitive coupling can be reduced by decreasing the relative permittivity (dielectric constant, k) of the dielectric (insulator) between adjacent lines.

Various dielectric materials have been suggested for use in silicon integrated circuits; namely, silicon dioxide (k about 4.0), fluorinated silicon dioxide (k about 3.0–4.0), organic materials such as polyimide, parylene, amorphous teflon (k about 1.9–3.9), and porous dielectrics such as silicon dioxide xerogels (k dependent upon porosity and typically 1.3–3.0). The porosity can be up to 99% by volume.

Timmons and coworkers demonstrated the use of a variable duty cycle pulsed plasma enhanced vapor phase deposition provides a high level of film chemistry controllability during polymerization of various monomers, such as perfluoropropylene oxide. The generality of the approach has been shown for a wide variety of monomers. For example, Labelle et al, Characterization of Pulse-Plasma Enhanced Chemical Vapor Deposited Fluorocarbon Thin Films, 1997 DUMIC Conference Proceedings, pages 98–105, describe pulsed plasma enhanced vapor phase deposition of a fluorocarbon polymer from a hexafluoropropylene oxide monomer and cite the apparent lack of formation of dangling bonds in the polymer.

However, fluorocarbon polymers have not yet become manufacturable for integrated circuit dielectrics.

SUMMARY OF THE INVENTION

The present invention provides a polymer with narrow gap filling or porosity plus a polymer deposition process using pulse plasma enhanced deposition plus optional anneal.

This has a technical advantage of a low dielectric constant material for integrated circuit including interconnects with small gaps.

BRIEF DESCRIPTION OF THE DRAWINGS

The drawings are heuristic for clarity.

DESCRIPTION OF THE PREFERRED EMBODIMENTS

Overview

The preferred embodiments include (1) carbon-based polymers with low dielectric constants which fill small (less than 0.3 um width), high aspect ratio (1 to 1 or greater) gaps between interconnects and/or which have high thermal stability and/or have high porosity, (2) the use of such polymers as a major component of interlevel dielectrics in multilevel interconnects for integrated circuits, and (3) pulsed plasma enhanced deposition and subsequent anneal methods for fabrication of such polymers and integrated circuits.

The fabrication methods may use one or more steps such as: deposition enhanced by a pulsed plasma at room temperature followed by an anneal in the range of 300–400 C.

The integrated circuit multilevel dielectric of gapfill, damascene, and slot fill types all may incorporate such polymers.

Gapfill with Etchback

FIGS. 1a–g illustrate in cross sectional elevation views the steps of preferred embodiment fabrication methods for integrated circuit (e.g., CMOS or BiCMOS) as follows.

Figure 1A:
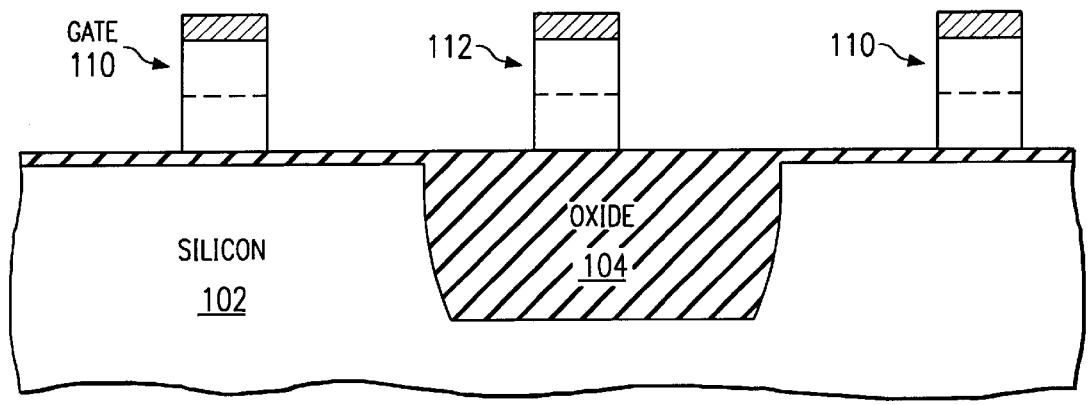
FIGS. 1a, b, c, d, e, f and g are cross sectional elevation views of a preferred embodiment integrated circuit fabrication method steps.
Figure 1B:
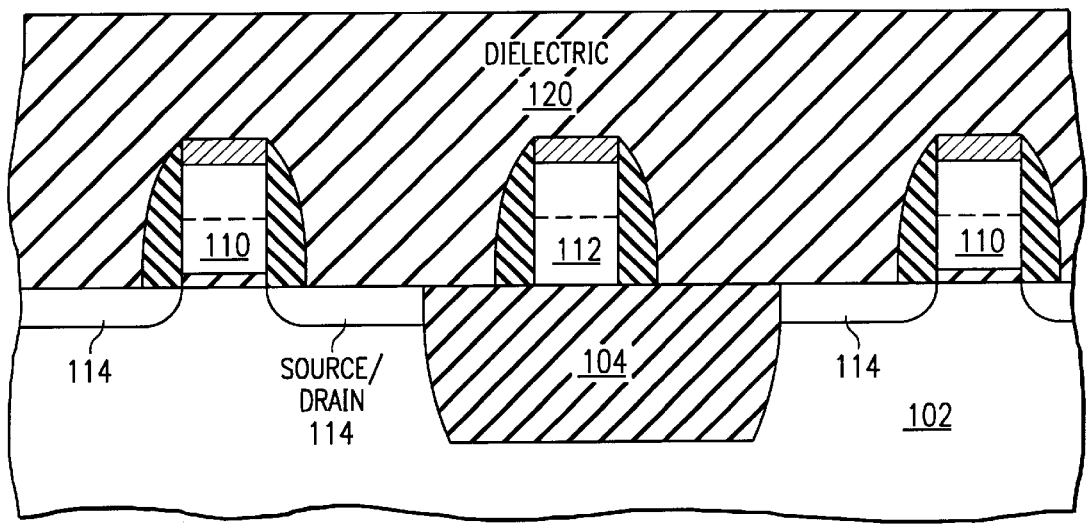

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 1a which shows silicon substrate 102 with shallow trench isolation oxide 104 plus gates 110 and gate level interconnect 112. Gates 110 may be 200–300 nm high and 130–250 nm long (FIG. 1a is a cross section along the gate length, and gates typically have widths much greater than their lengths). An alternative would be formation of polysilicon gates followed by a self-aligned silicidation (after the source/drain and sidewall dielectric formation of the next step) to create a silicide on both the gate top and the source/drains.

(2) Perform lightly doped drain implants, and then form sidewall dielectric on the gates by deposition plus anisotropic etching. Introduce dopants to form sources and drains 114. Cover the gate level structure with a planarized dielectric layer 120 (such as BPSG or a stack of conformal and planarized layers with the top layer an undoped oxide such as a deposition from TEOS); see FIG. 1b.

(3) For a structure with an embedded memory cell array using one-transistor one-capacitor memory cells, the bitlines and cell capacitors may be formed next. For clarity such steps are not illustrated and attendant additional dielectrics deposited on dielectric 120 will just be considered part of dielectric 120.

(4) Photolithographically define and etch holes (contacts, vias) in planarized dielectric 120 down to selected source/drains 114 and locations on gate level interconnects 112 (and also to selected bitline locations for embedded memory). Blanket deposit (including filling vias) a metal stack such as 50 nm of Ti, 50 nm of TiN, 500 nm of W or Al (doped with Cu and Si), and 50 nm of TiN; the bottom Ti and TiN form a diffusion barrier and the top TiN forms an antirefletive coating for lithography. Prior to the W or Al deposition the bottom Ti may be reacted with the source/drain to form a silicide to stabilize the metal-to-silicon contact. The Ti and TiN may be deposited by physical vapor deposition (PVD) or chemical vapor deposition (CVD) (e.g., TDMAT+NH3); the aluminum may be deposited by PCD and then forced into the vias under high pressure or by CVD; and W may be deposited by CVD. Alternatively, the vias may be filled with W by a CVD blanket deposition followed by an etchback to leave W only in the vias (W plugs), and then blanket Ti, TiN, Al, and TiN depositions.

Figure 1C:
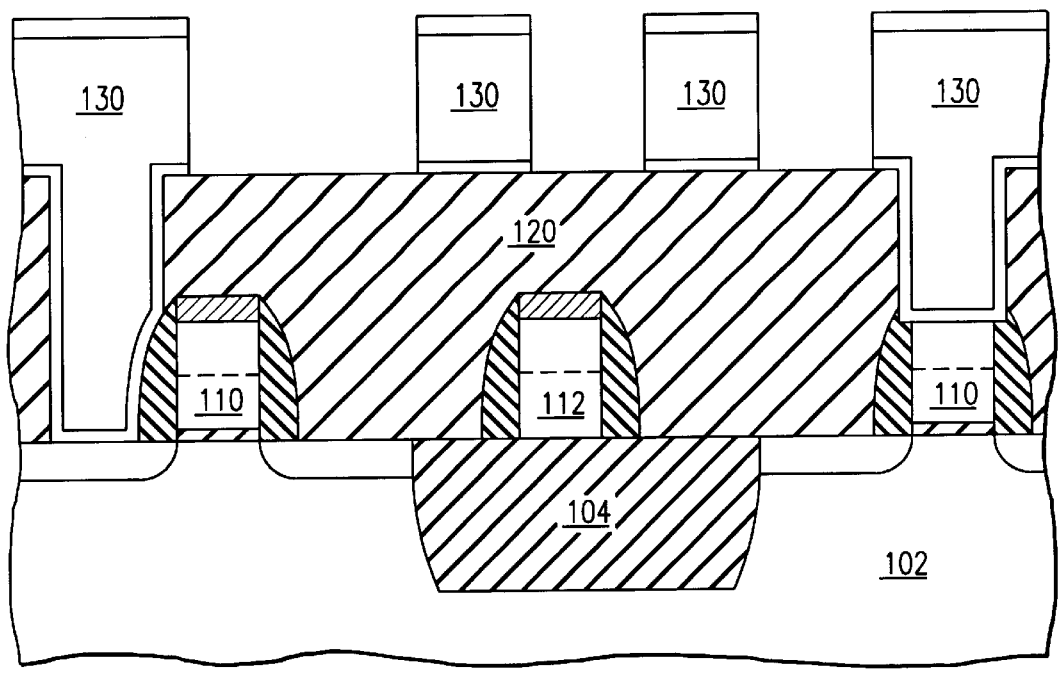
Figure 1D:
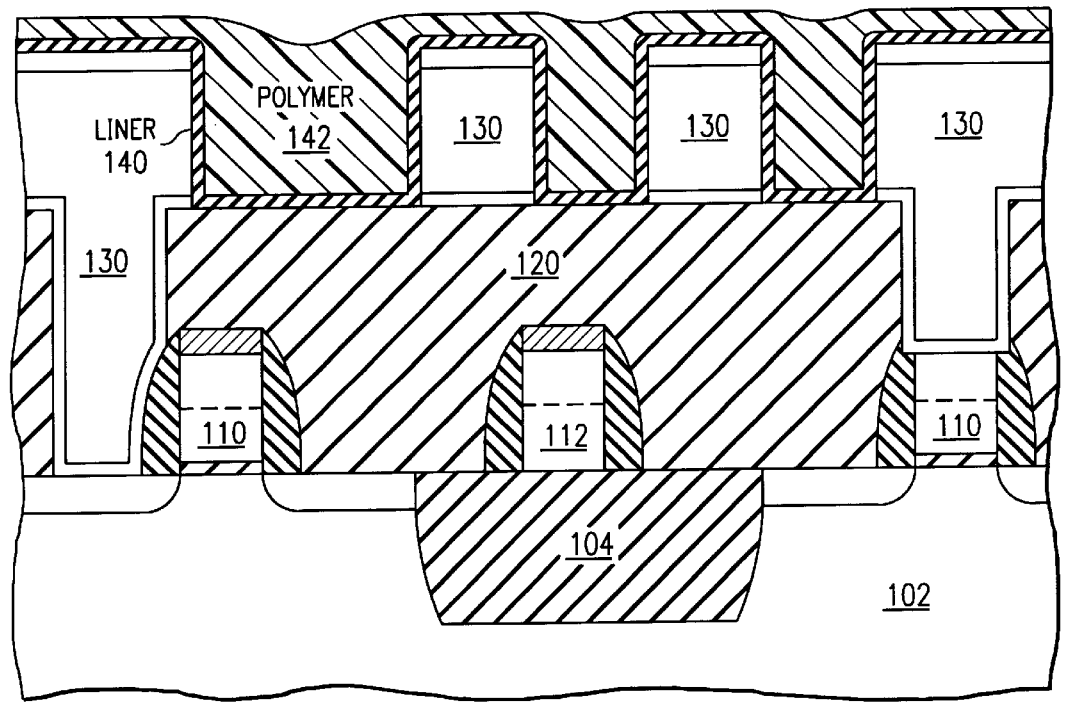

(5) Photolithographically define and etch the first level metal to form first level interconnects 130; see FIG. 1c. The gaps between adjacent interconnects 130 may be on the order of 200–300 nm, and these minimal gaps dominate the capacitive couplings.

(6) Deposit a 20–50 nm thick conformal oxide liner 140 on interconnects 130 plus exposed dielectric 120 by plasma-enhanced decomposition of TEOS with oxygen or ozone. Liner 140 passivates the metal surfaces and prevents diffusion of metal along any pores of the subsequent deposited polymer and further prevents reaction of metal with fluorine from fluoropolymers. It also provides mechanical strength to suppress electromigration and suppress interconnect-to-interconnect leakage currents. Other dielectric liner materials may be used, but the liner material contributes to the effective dielectric constant between the minimal gaps. Thus high dielectric constant liner material must be very thin.

(7) Insert the wafer into a pulse plasma enhanced deposition reactor and deposit a layer of fluorinated polymer 142 on liner 140. Polymer layer 142 may be thick enough to cover the tops of the interconnects 130 by roughly 100 nm, fill the minimal gaps between interconnects, and be roughly 300 nm thick in any open areas away from the interconnects. See FIG. 1d.

The deposition reactor may be a glass cylinder with the RF (13.56 MHz) plasma discharge powered by two concentric ring electrodes located around the exterior of the glass cylinder. A pulse generator powers the electrodes to provide an intermittent plasma within the reactor. For example, the pulse generator provides a pulse of 1 millisecond (msec) duration and energy to strike a plasma with a peak power density of roughly 60 milliwatts/cm3; the 1 msec pulse is followed by a 5–40 msec interval of no power input and an extinguished plasma. Thus the time average power density at the wafer surface is on the order of only 1 milliwatt/cm3. The plasma potential with respect to the wafer is small (e.g., on the order of 100 volts), so the ion bombardment of the growing polymer is intermittent and of low energy.

Fluorinated polymer 142 may be grown from monomers of 3-(pentafluorophenyl)pentafluoro-1-propene [(C6F5) CF2CF=CF2]. Indeed, introduce a flow of monomer vapor into the pulse plasma deposition reactor to maintain a pressure of 30 mTorr (4 Pa); the monomer flow rate depends upon the deposition rate and the reactor exhaust pump capacity. Also, a carrier gas such as argon for the monomers may be used to increase total flow rates and uniformity and plasma ignition.

During the 1 msec plasma intervals a fraction of the monomers are excited and some become free radicals or ions, and the ions bombard the wafer surface and help activate adsorbed monomers and growing polymer but also contribute to fragmentation. During the 5–40 msec intervals between plasmas the ions are quickly neutralized, but the excited monomers, free radicals, and activated surface species remain active for some time and drive polymerization at the surface. The following sections detail experimental results of the pulse plasma deposition-polymerization and show preferred embodiment deposition conditions.

(8) After the deposition of polymer layer 142 in a pulse plasma deposition reactor, insert the wafer into a furnace and anneal at 300–400 C. in a nitrogen (or other inert) atmosphere for 20 minutes. This will drive out unreacted monomers and small oligomers creating pores within the polymer. Indeed, the creation of these pores helps to reduce the dielectric constant of the resultant polymer layer.

Figure 1E:
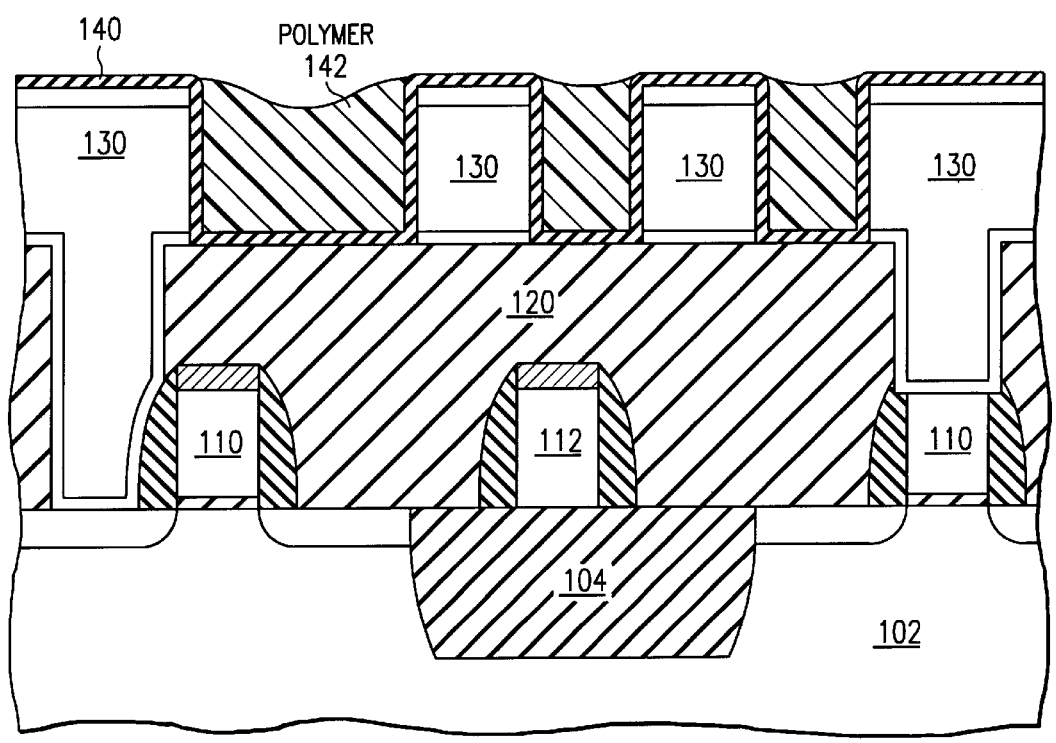
Figure 1F:
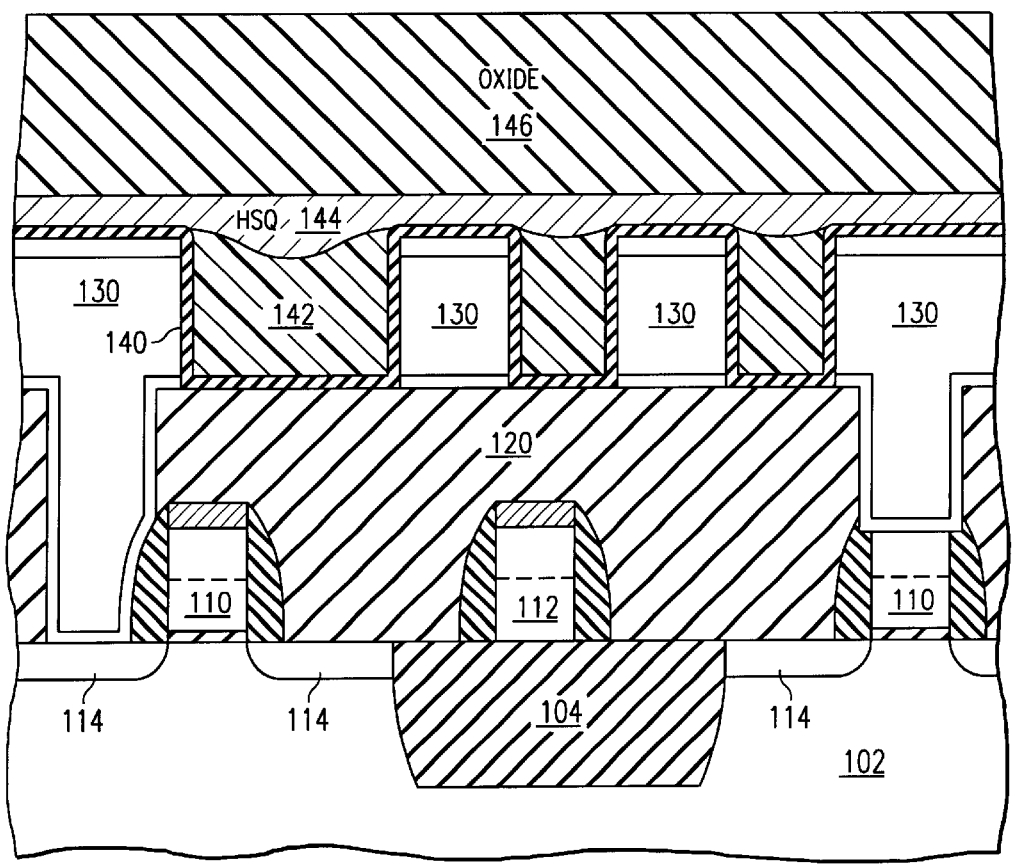

(9) Etchback the polymer 142 about 100 nm to expose the liner on the tops of the interconnects 130; see FIG. 1e. The etchback may be by a fluorine-oxygen-based plasma. This etchback to clear the polymer from the tops of the interconnects 130 has the advantage that vias in the next level of interconnects will not have to be etched through polymer, so lateral etching control may be simple and outgassing from the polymer into etched vias will not be a problem; see FIG. 1e.

(10) Spin on 200–300 nm average thickness layer 144 of hydrogen silsesquioxane (HSQ) and cure it at 400 C. HSQ layer 144 adheres to underlying polymer 142 and provides a good surface for subsequent deposition of a thick capping dielectric (e.g., oxide 146); see FIG. 1f. Without HSQ adhesion layer 144, the surface of polymer 142 may provide poor adhesion for oxide deposited by plasma-enhanced TEOS decomposition.

Figure 1G:
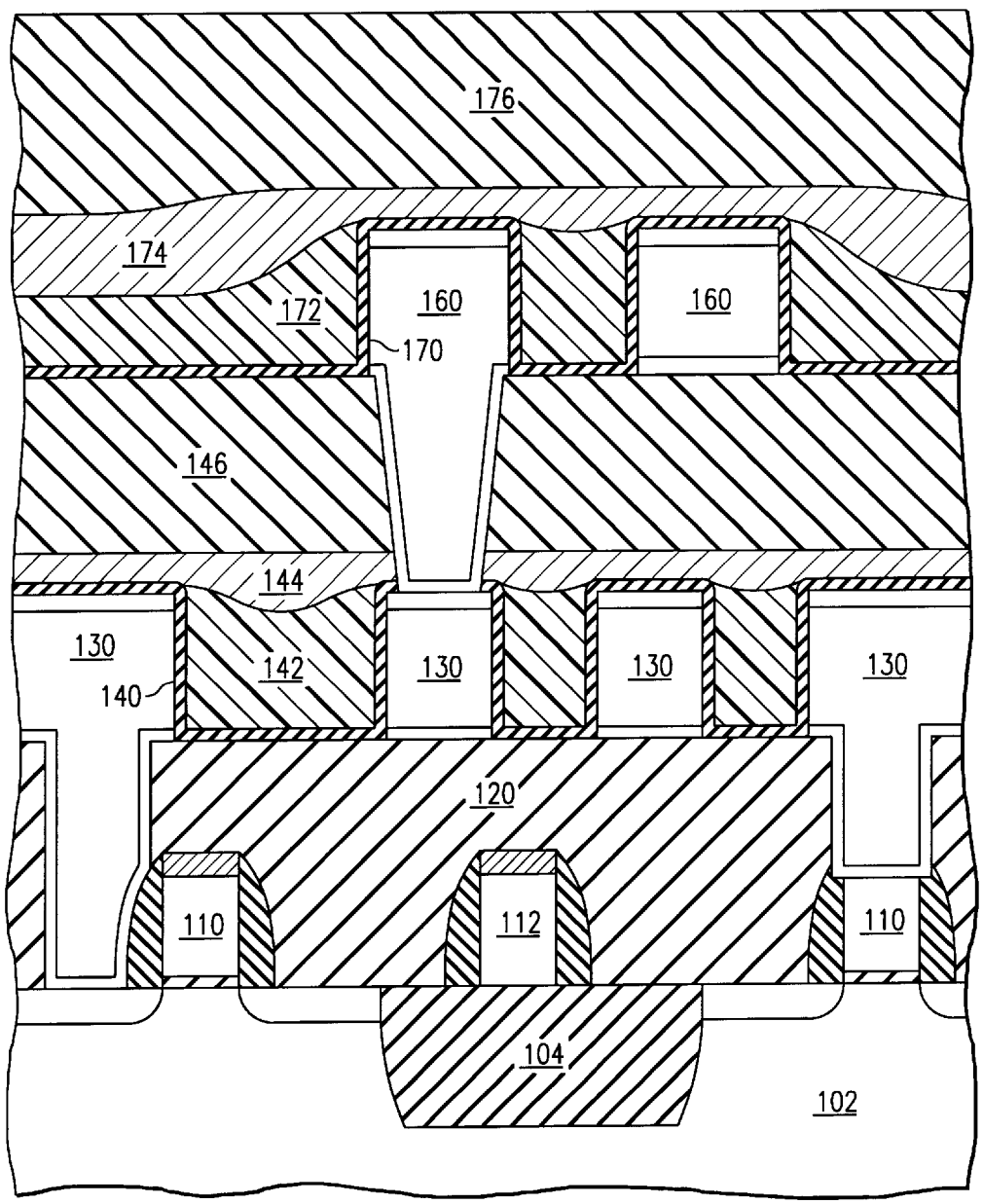

(11) Deposit a 1500 nm thick dielectric 146 on the HSQ surface by plasma enhanced decomposition of TEOS with oxygen or ozone. Then planarize dielectric 146 with chemical mechanical polishing (CMP) to provide for an intermetal level dielectric thickness of about 1000 nm; see FIG. 1f. This completes the first metal level interconnects; and further levels result from repetition steps (4)–(11) where the vias in the planarized dielectric extend down to immediately underlying interconnects. In particular, FIG. 1g illustrates second level interconnects 160 with liner 170, polymer layer 172, adhesion HSQ 174, and overlying oxide 176. Note that a via may effectively extend through two or more levels by simply forming a vertical stack of vias and overlying small metal patches. Lastly, a passivation overcoat may be applied followed by openings in the overcoat for fuses blowing and bond pads or balls.

Experimental Polymerization Results

Variations of the pulsed plasma deposition-polymerization conditions lead to unexpected differences in the resulting polymer layer characteristics such as gap filling, thermal stability, porosity, and so forth. The conditions include the plasma pulse interval duration (on time), the ratio of the plasma duration to the between plasma intervals duration (on time to off time), plasma power density, anneal temperature, and precursor (monomer or comonomers for copolymers) selection. The following sections detail various preferred embodiments relating to these parameters.

Gap Filling Deposition

Figure 5A:
FIGS. 5a, b, c, d, e and f illustrate various deposition conditions.
Figure 5B:
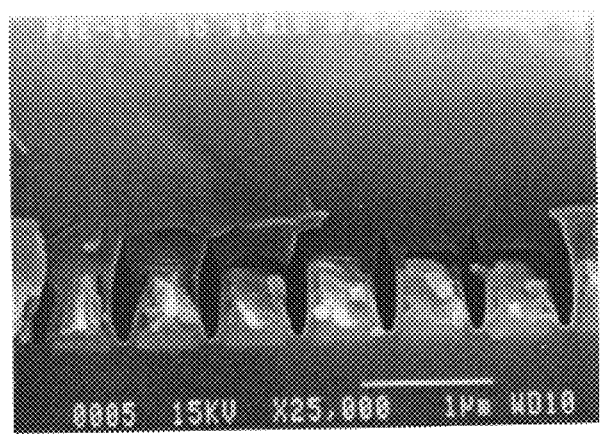
Figure 6A:
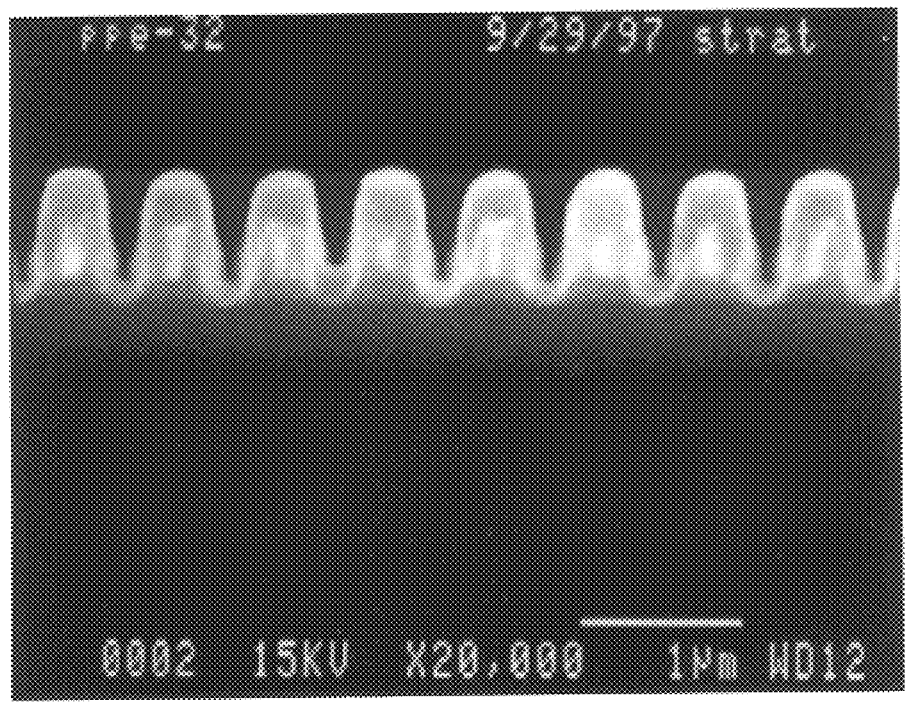
FIGS. 6a–b illustrate various deposition conditions.
Figure 6B:
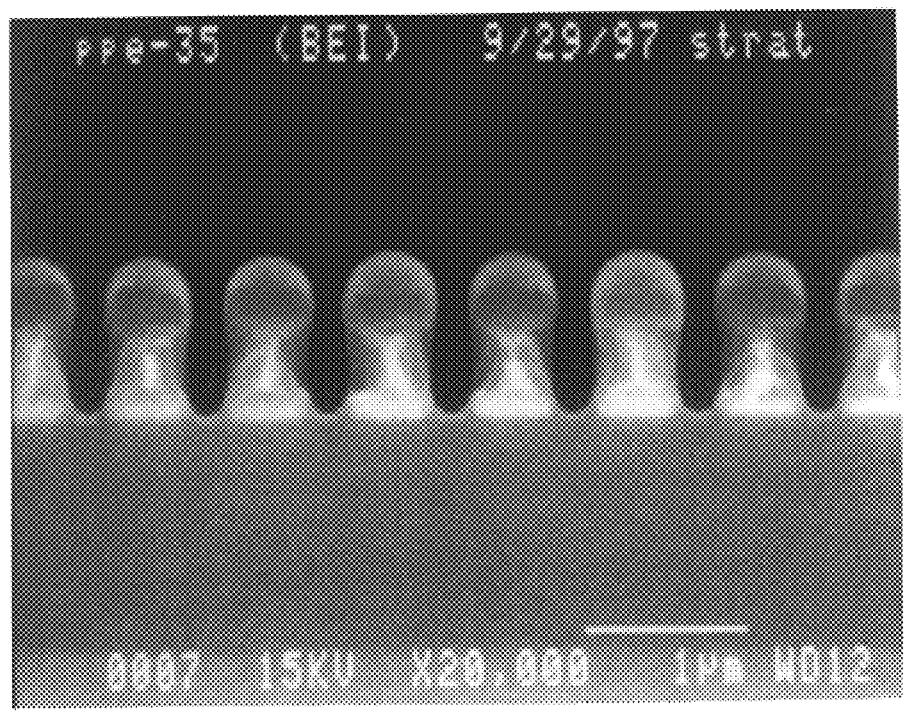
Figure 7A:
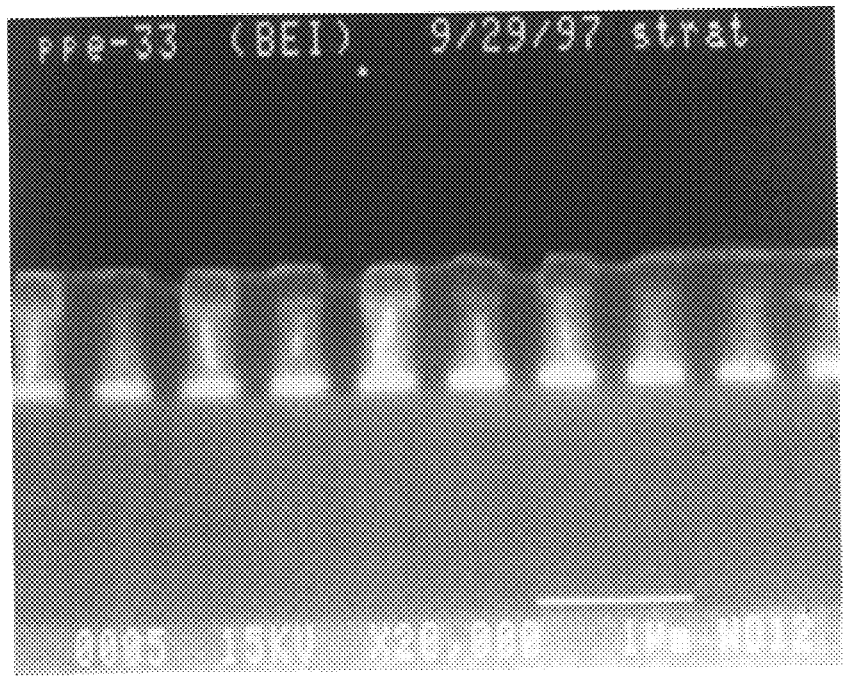
FIGS. 7a–b illustrate various deposition conditions.
Figure 7B:
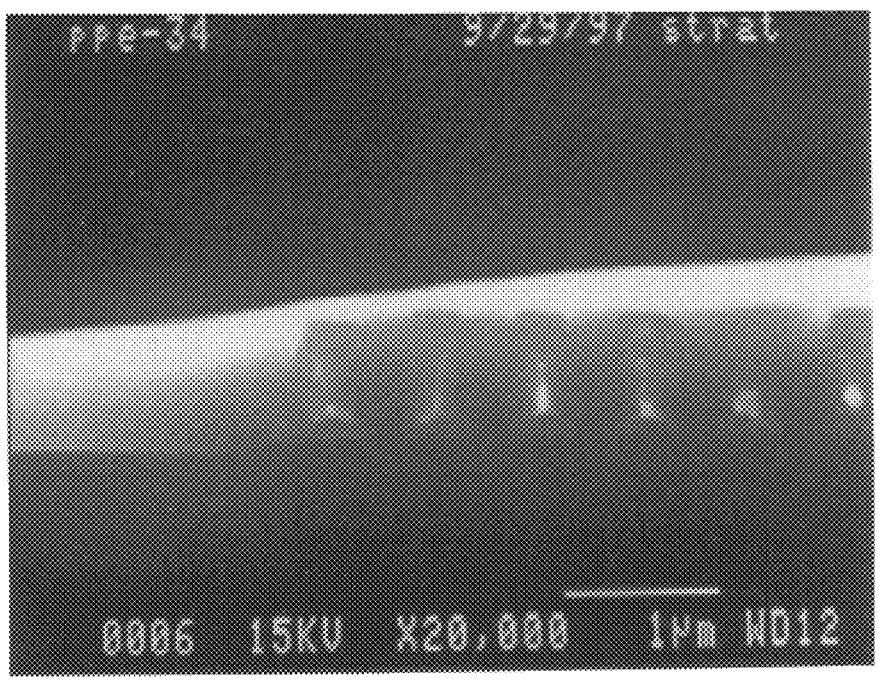

FIGS. 5a, b, c, d, e and f illustrate, as a function of the off time, the pulse plasma deposited polymer gap filling between interconnects spaced about 0.3 um apart and with the gaps having an aspect ratio (height to width) of about 2. The monomer was 3-(pentafluoro-phenyl)pentafluoro-1-propene at a pressure of 30 mTorr and a room temperature substrate; the peak plasma power density was 60 milliwatts/cm3 during the on time of 1 msec. For off times of 5, 10, 20, 25, and 30 msec voids formed in the gaps, but with an off time of 40 msec the gaps were completely filled without voids. In all cases the polymer layer extended well above the tops of the interconnects and had a fairly planar surface. Further, FIGS. 6a–b shows the initial stages of the depositions for 40 msec and 10 msec off times, respectively. The 40 msec off time yields a better than conformal gap filling in that the bottom of the gaps apparently fills faster, whereas the 10 msec off time shows less than conformal polymer bulging at the tops of the interconnects. Thus unexpectedly the off time apparently determines the gap filling capabilities of the pulse plasma deposition: gap filling requires an off time of more than 30 msec for an on time of 1 msec and peak power density of 60 milliwafts/cm3. Also, FIGS. 7a–b show the planarity of the 40 msec off time gap fill; indeed, FIGS. 6a, 7a, 7b show the sequence of gap filling after 5, 10, and 20 minutes of deposition, respectively.

Figure 5C:
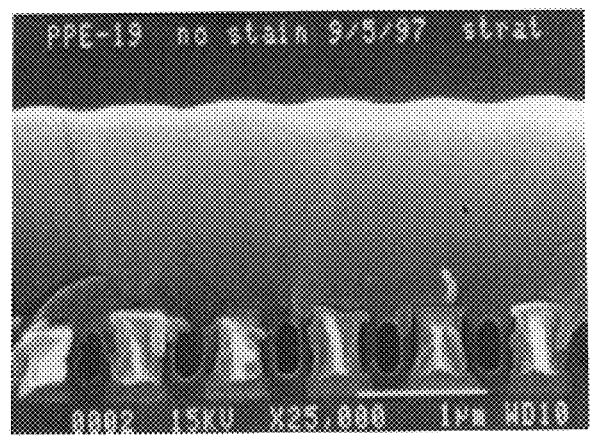
Figure 5D:
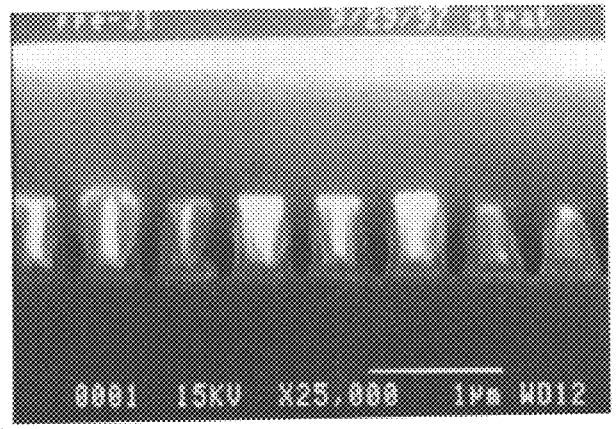
Figure 5E:
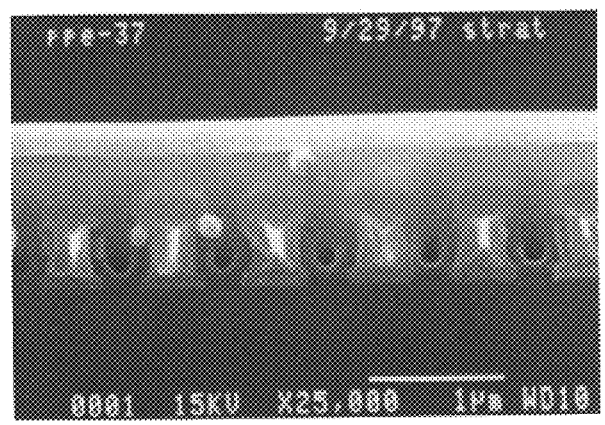
Figure 5F:
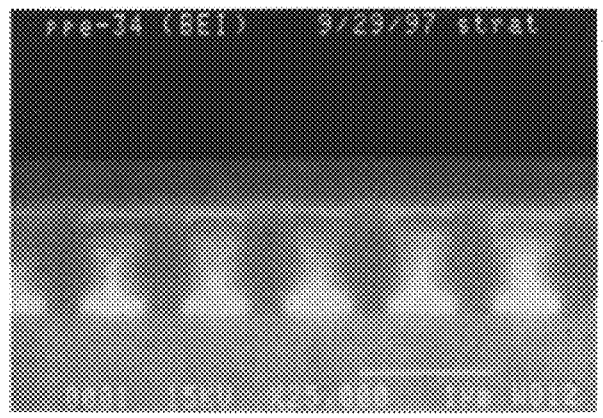
Figure 8A:
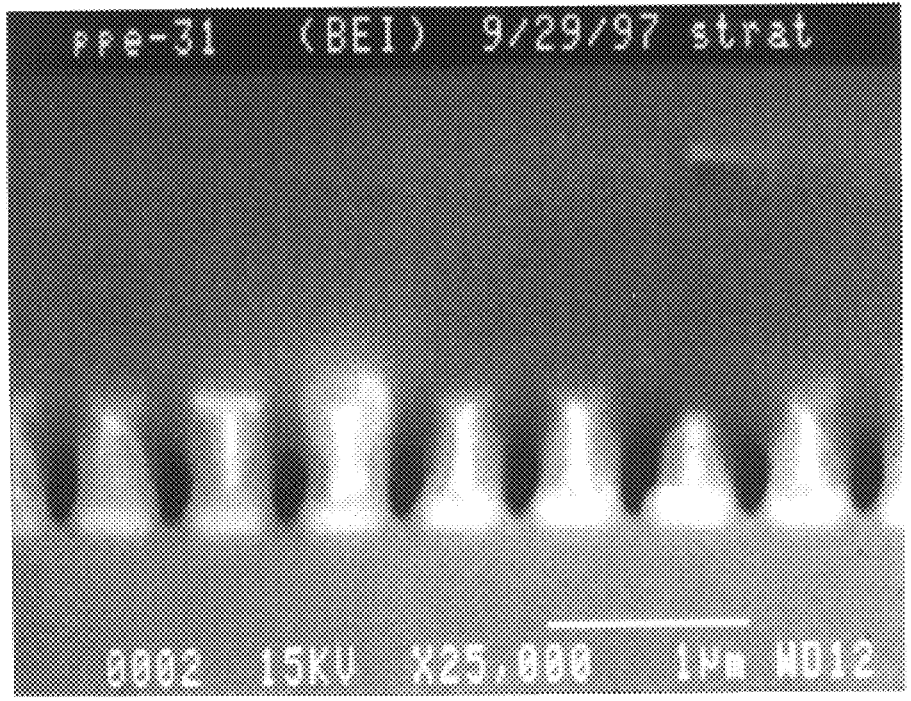
FIGS. 8a–b illustrate various deposition conditions.
Figure 8B:
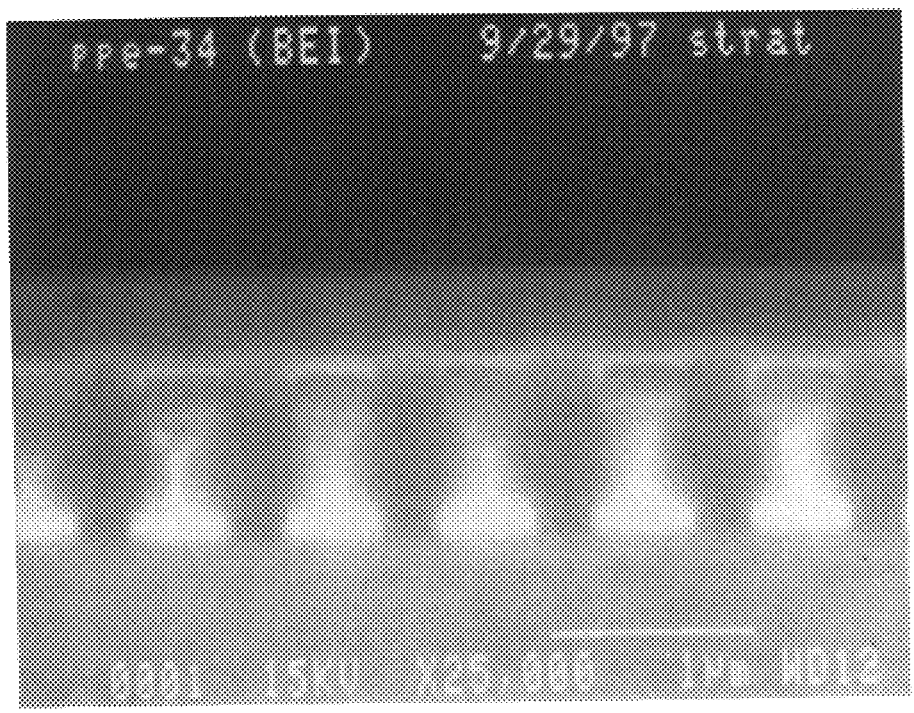

FIGS. 8a–b compare the polymer deposited with 1 msec plasma on time and 40 msec off time for two different peak plasma power densities, namely about 240 milliwatts/cm3 in FIG. 8a and about 60 milliwatts/cm3 in FIG. 8b (which is the same as FIG. 5f). The higher plasma power deters the better than conformal gap filling and looks more like the shorter off time results with voids in the gaps as in FIG. 5d. Thus, gap filling conditions appear to require a longer off time for a higher power density with the same on time; that is, larger plasma energy input requires longer off times to achieve gap filling.

Figure 9:
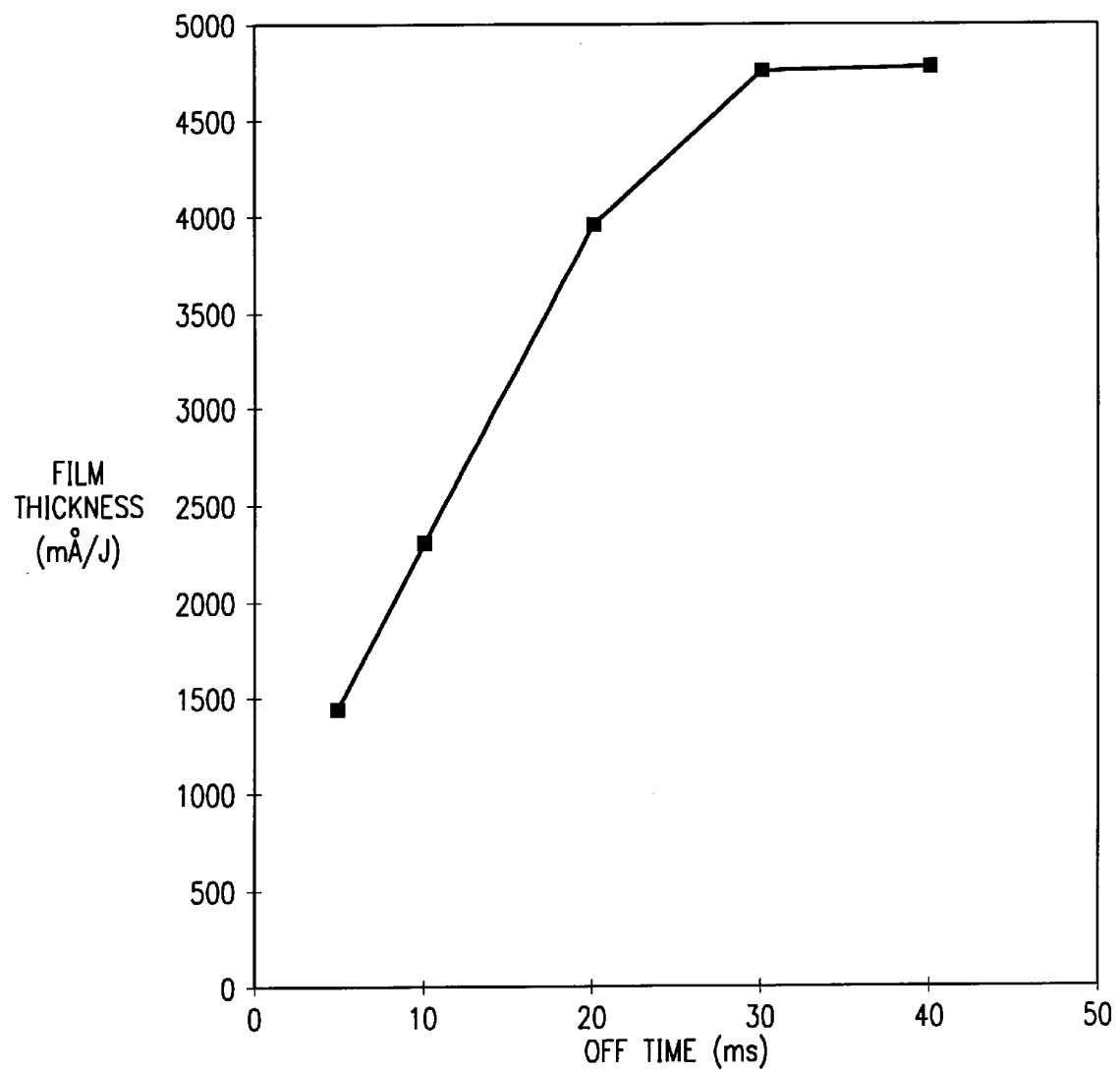
FIG. 9 shows growth efficiency.
Figure 10A:
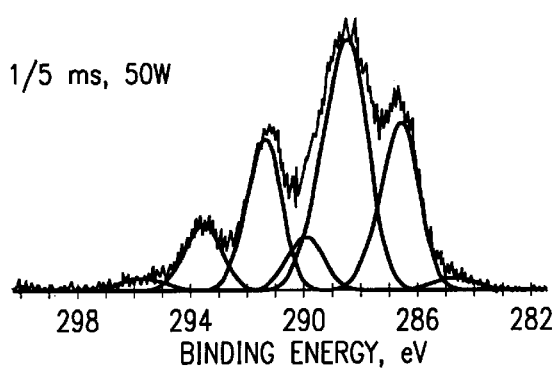
FIGS. 10a, b, c and d show compositional analysis.
Figure 10B:
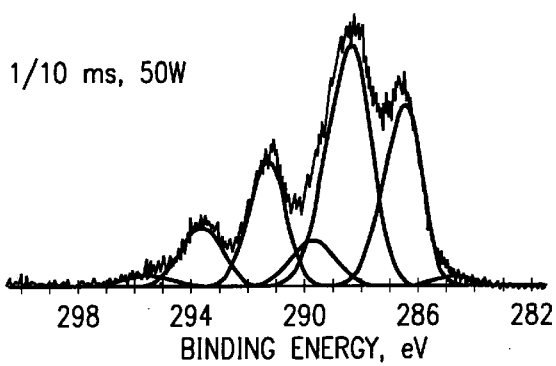
Figure 10C:
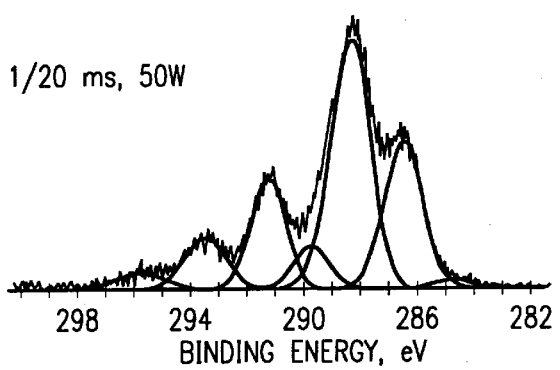
Figure 10D:
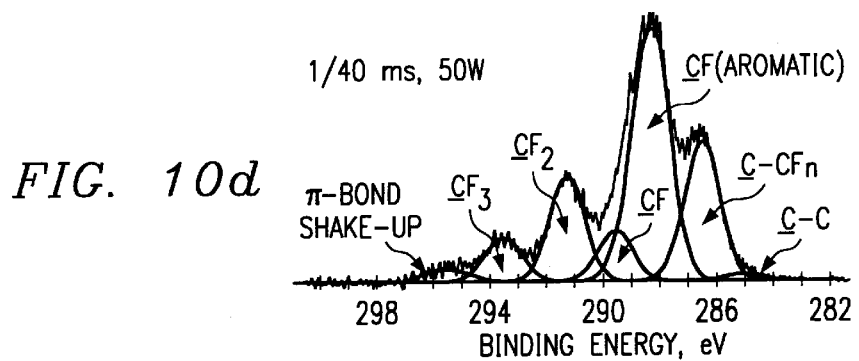
Figure 11A:
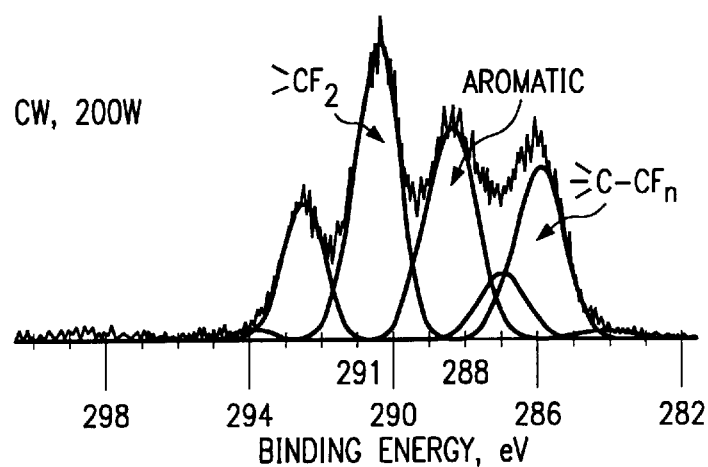
FIGS. 11a, b and c show compositional analysis.
Figure 11B:
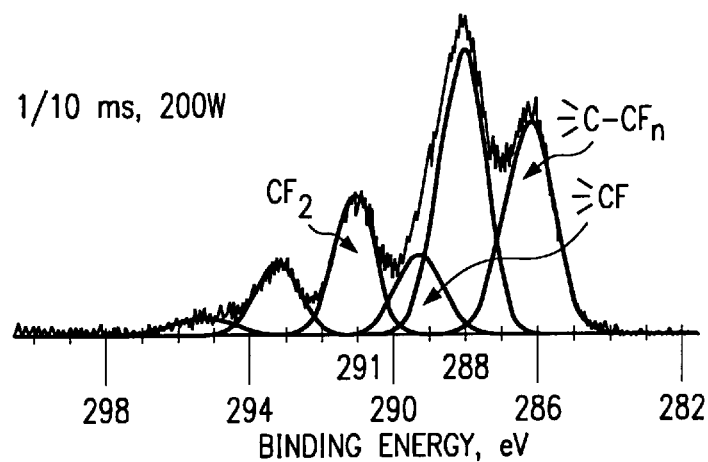
Figure 11C:
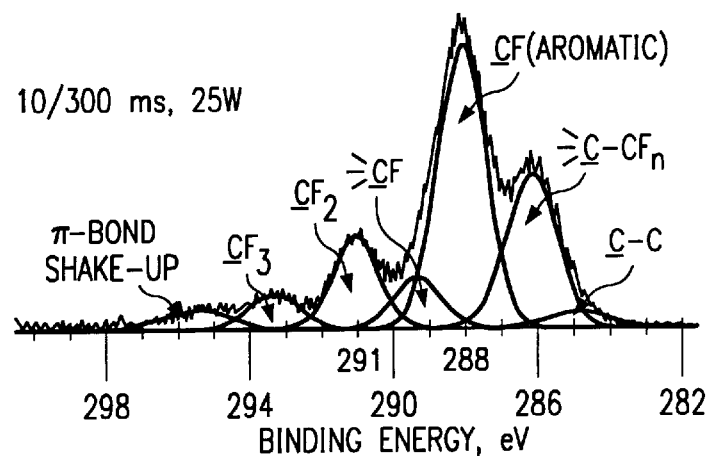

Indeed, FIG. 9 illustrates polymer layer growth efficiency (polymer growth per joule input) as a function of off time for a 1 msec on time and a peak plasma power density of about 60 milliwatts/cm3. FIG. 9 shows the growth efficiency saturating at an off time of 30–40 msec which is about the same off time to achieve gap filling without voids. Thus, if the input energy from the plasma (on time) can all be used for polymer growth (on time plus off time), then the gap filling minimum off time would be proportional to the on time and to the peak power inputs. If the off time falls below the gap filling minimum, then the input energy will be dissipated in other forms, such as less surface migration of radicals and monomers into the gaps and more crosslinking within the polymer. However, FIGS. 10a, b, c and d show the x-ray photoelectron spectroscopy (XPS) analysis (carbon 1s electrons) of the constituents of the polymers deposited with about 60 milliwatts/cm3 peak plasma power density for 1 msec on times and 5, 10, 20, and 40 msec off times. The Figures show the relative amount of various carbon bondings (labelled in FIG. 10d), but do not indicate a dramatic change in composition corresponding to change in gap filling. In contrast, FIGS. 11a–c illustrate the change in carbon bonding for polymers deposited with a continuously-on plasma at a power density of about 240 milliwatts/cm3 (FIG. 11a), a pulsed plasma with a peak power density of about 240 milliwatts/cm3 and with 1 msec on time and 10 msec off time (FIG. 11b), and a pulsed plasma with a peak power density of about 30 milliwatts/cm3 and with 10 msec on time and 300 msec off time (FIG. 11c). The continuously-on plasma has a large fraction of CF2 bonding (e.g., teflon), whereas the pulsed plasmas yield a greater fraction of CF(aromatic) bonding which indicates that the phenyl ring is being preserved. The lower the average power input, the greater the aromatic fraction.

The gap filling and planarizing features of the pulsed plasma deposition may be used on applications other than integrated circuit dielectrics. In particular, the chemical inertness of fluorocarbons has application in biological devices: small diameter tubing (e.g., lumens) can be coated on the inside, small crevices in surfaces of materials may be filled, and membranes with small openings can have the openings diminished in size for use as molecular sieves.

Thermal Stability Deposition

The thermal stability of a pulsed plasma enhanced deposited polymer layer improves as the plasma power input increases and the off time decreases during deposition; however, even a layer deposited with a continuously-on plasma with a power density of 240 milliwatts/cm3 shows significant weight loss at 300 C.

Figure 12:
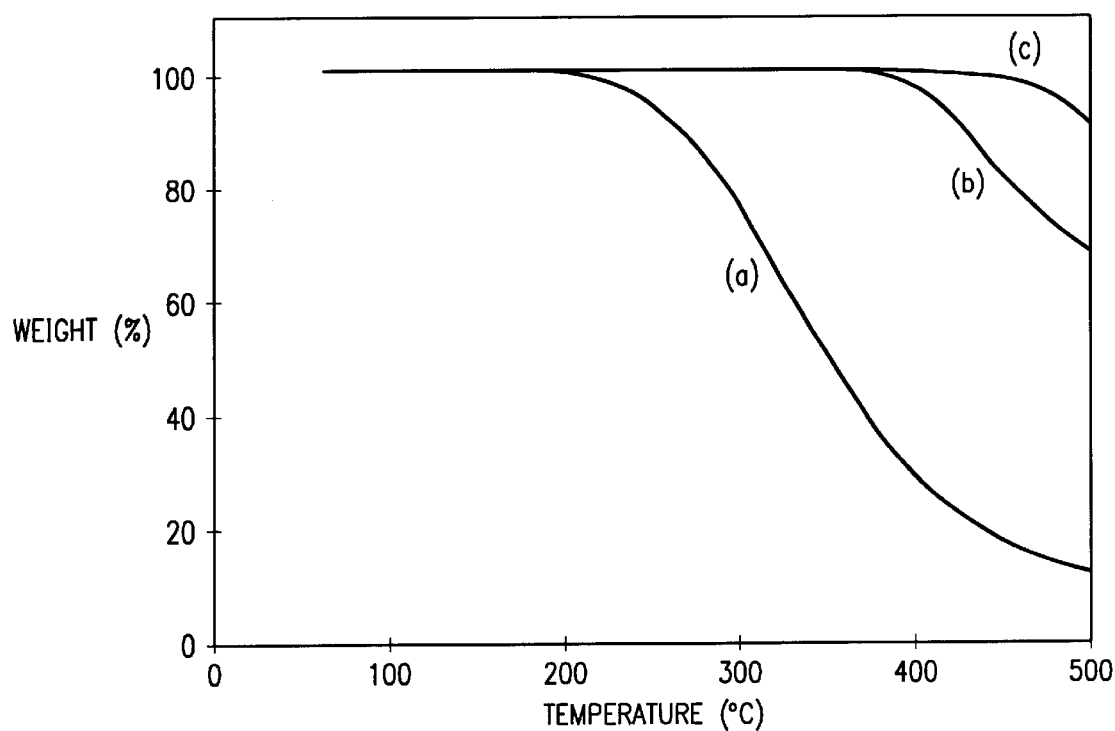
FIG. 12 illustrates thermal stability.

A preferred embodiment polymer deposition method anneals a low power pulsed plasma deposited polymer layer to achieve thermal stability greater than that of high power continuous plasma deposited polymers. In particular, polymer layers deposited with a power density of 60 milliwatts/cm3 for 1 msec on times and 10 msec off times from the monomer 3-(pentafluorophenyl)penta-fluoro-1-propene annealed for one hour at 350 C. and at 400 C. under nitrogen (or other inert gas) atmosphere exhibit dramatically improved thermal stabilities. FIG. 12 shows the resulting thermal stability of the layers: curve (a) shows the as-deposited polymer layer weight loss as a function of temperature, curve (b) shows the 350 C. annealed polymer layer weight loss, and curve (c) shows the 400 C. annealed polymer layer weight loss. The annealed polymer layers have sufficient thermal stability for use in integrated circuits.

Figure 14:
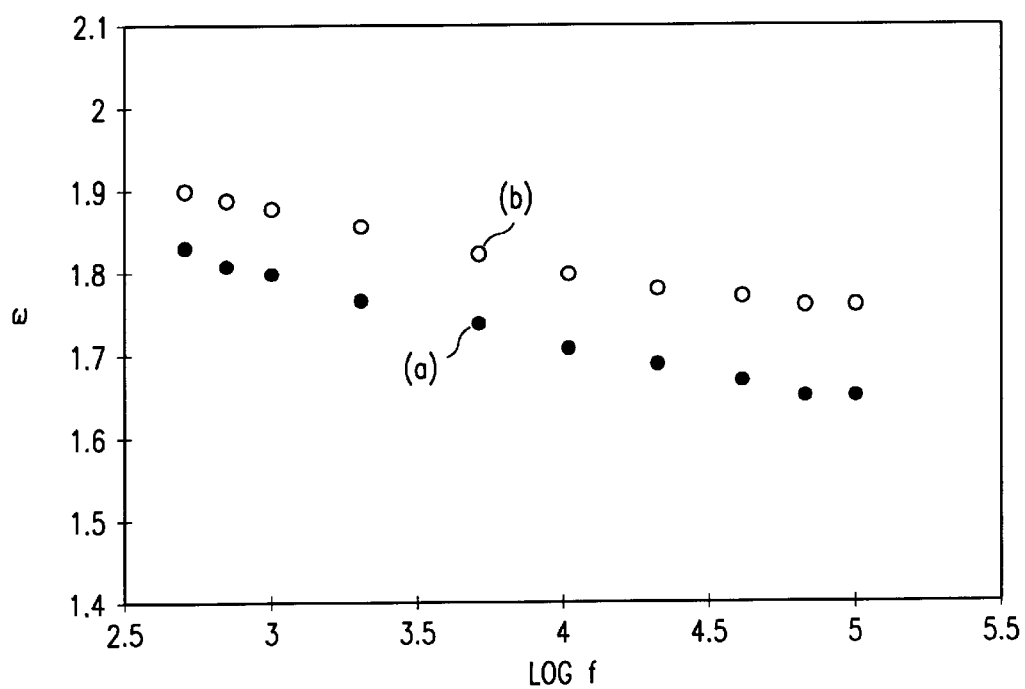
FIG. 14 shows dielectric constants.
Figure 13A:
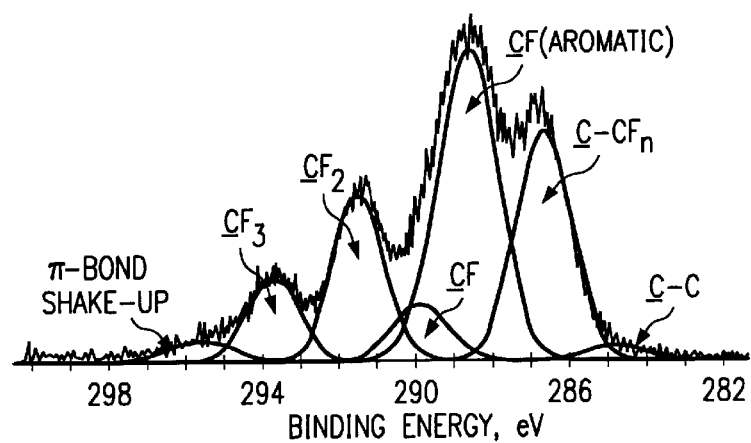
FIGS. 13a, b and c show compositional analysis.
Figure 13B:
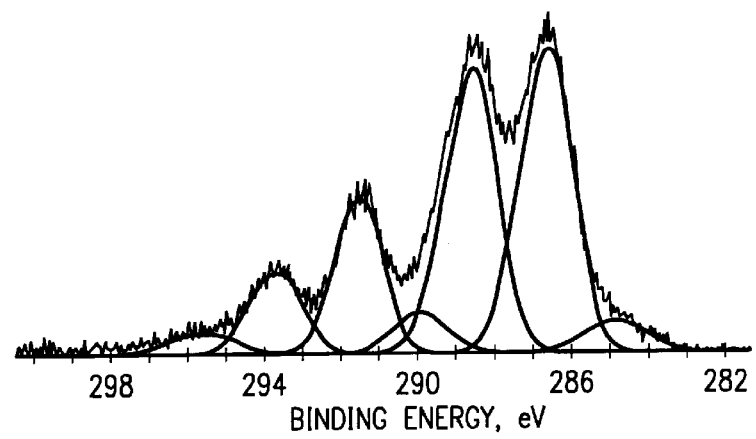
Figure 13C:
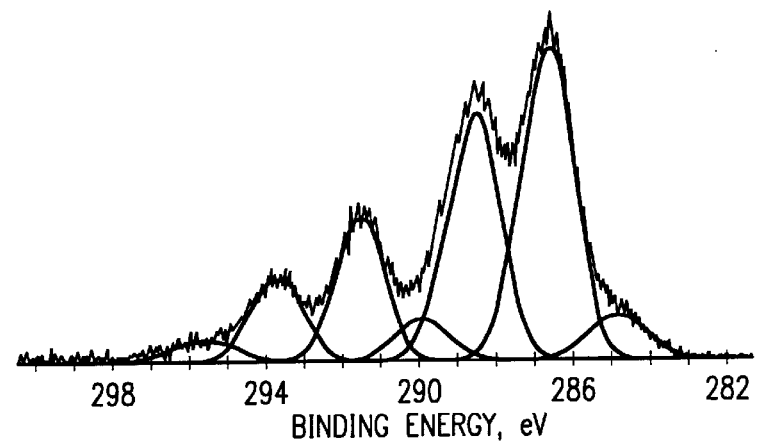

FIGS. 13a–c show the change in carbon bonding due to the annealing: FIG. 13a is the unannealed, FIG. 13b the annealed at 350 C., and FIG. 13c the annealed at 400 C. These Figures indicate an increase in carbon-carbon crosslinking and small loss of fluorine. Note that the fluorine to carbon ratio changes from 1.09 to 0.958 to 0.927 for the unannealed to 350 C. annealed to 400 C. annealed polymers. However, the dielectric constant changes little with the annealing: FIG. 14 illustrates the dielectric constant as function of frequency as measured with the polymer layer as the dielectric in a planar capacitor. Points (a) are the dielectric constant for the unannealed polymer and the points (b) for the 400 C. annealed polymer. The annealing slightly increased the dielectric constant, although the dielectric constant remained below 2.0.

Porous Polymer Deposition

Figure 15A:
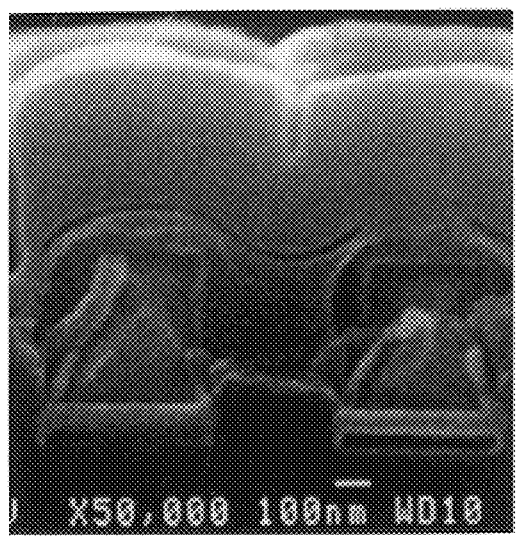
FIGS. 15a–b illustrate porous polymers.
Figure 15B:
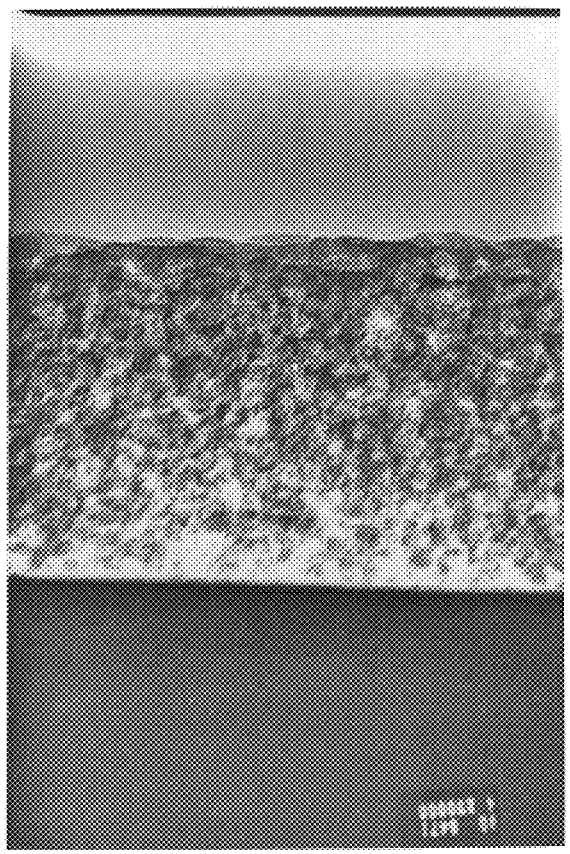

Pulsed plasma deposition of 3-(pentafluorophenyl) pentafluoro-1-propene polymer layer under conditions of peak plasma power density of about 60 milliwatts/cm3 for 1 msec on times and 40 msec off times apparently contains a large fraction of trapped monomers and small oligomers within the polymer network. Then an anneal at 400 C. in a nitrogen atmosphere can drive out the monomers and small oligomers and yield a porous polymer. Curve (a) of FIG. 12 indicates the large weight loss of the polymer upon annealing, and this weight loss presumably includes monomers and small oligomers. Further, for polymer in narrow gaps, the adhesion of the polymer to the sidewalls of the gaps will deter collapse of the polymer during the annealing; thus, a gap fill with a porous polymer will result. FIG. 15a shows porous polymer between two metal lines and FIG. 15b is a TEM showing the porosity. The porosity will help decrease the dielectric constant in the gaps between interconnects in an integrated circuit. In fact, the anneal to drive out the monomers and small oligomers can be performed either immediately after deposition (and any etchback) of the polymer layer (e.g., FIGS. 1d or 1e) or after a capping (adhesion) layer has been formed on the polymer (e.g., FIG. 1f). When HSQ is used as an adhesion layer, an HSQ cure at 400 C. may also be the porosity creating anneal for the polymer.

An alternative preferred embodiment makes direct use of the presence of relatively large voids created between the metal lines during pulsed plasma depositions, such as those shown in FIGS. 5c, 5d, and 5e. As shown in these Figures, it is possible to control the magnitude of the voids by simple adjustment of the pulsed plasma duty cycles (and/or the peak powers) employed during polymer layer formation. The presence of the large voids will have the beneficial and desirable effect of contributing to an overall lowered dielectric constant, especially in the minimal gaps. FIGS. 5c–e and FIG. 9 indicate that use of an on time to off time ratio that gives at least roughly ⅔ maximum growth efficiency yields voids with smooth contours and located about the centers of the gaps.

A further preferred embodiment locates the wafer acquiring the pulsed plasma enhanced polymer deposition remote from the plasma discharge zone. The wafer could be either upstream or downstream from the plasma zone. In this case the resulting polymer will be less cross-linked and incorporate a higher portion of monomer functionalities than polymer deposited in the plasma discharge zone. This reflects the less energetic conditions prevailing in such remote regions, relative to that present in the actual discharge zone. Thus polymer layers deposited on substrates located outside the immediate plasma reactor region will also exhibit improved thermal stabilities after the annealing process, along with relatively little change in their dielectric constants.

Gapfill Without Etchback

Figure 2A:
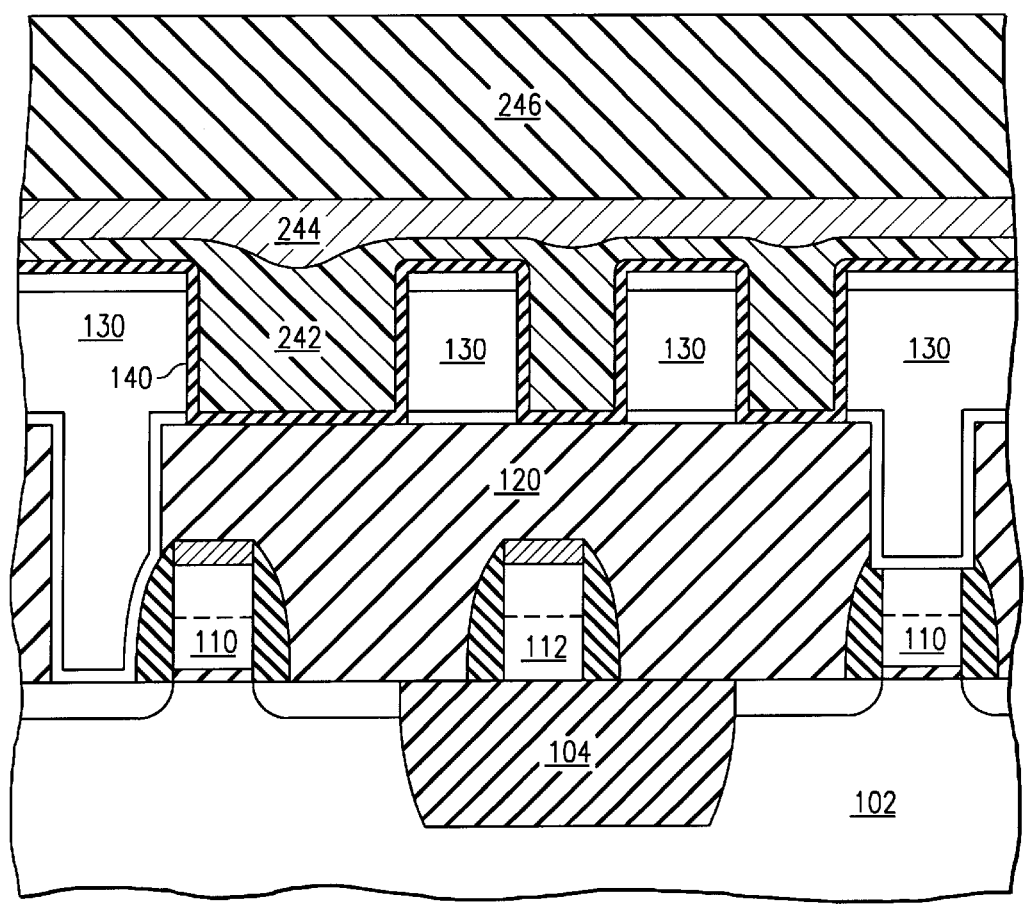
FIGS. 2a–b illustrate in cross sectional elevation views another preferred embodiment.

The preceding preferred embodiment etched back the polymer in step (9) to expose the liner on top of the interconnects. In contrast, the nonetchback preferred embodiment omits this etchback step and spins on the adhesion layer (e.g., HSQ) immediately after completion of the polymer deposition (with or without annealing). Thus follow preceding steps (1)–(8), corresponding to FIGS. 1a–d, skip step (9), and continue with step (10). See FIG. 2a showing 100-nm-average-thickness adhesion layer 244 on as-deposited polymer 242 with 700 nm thick planarized dielectric layer 246 on the adhesion layer.

As in preceding preferred embodiment step (11), next define and etch vias through dielectric 246, adhesion layer 244, polymer 242, and liner 140 down to interconnects 130. Note that the via etch only goes through about 100 nm of polymer 242. Experimentally, the exposed polymer appears not to contaminate the via bottom, and TiN or Ti/TIN barrier of interconnect 260 makes a good interface with polymer 242.

Figure 2B:
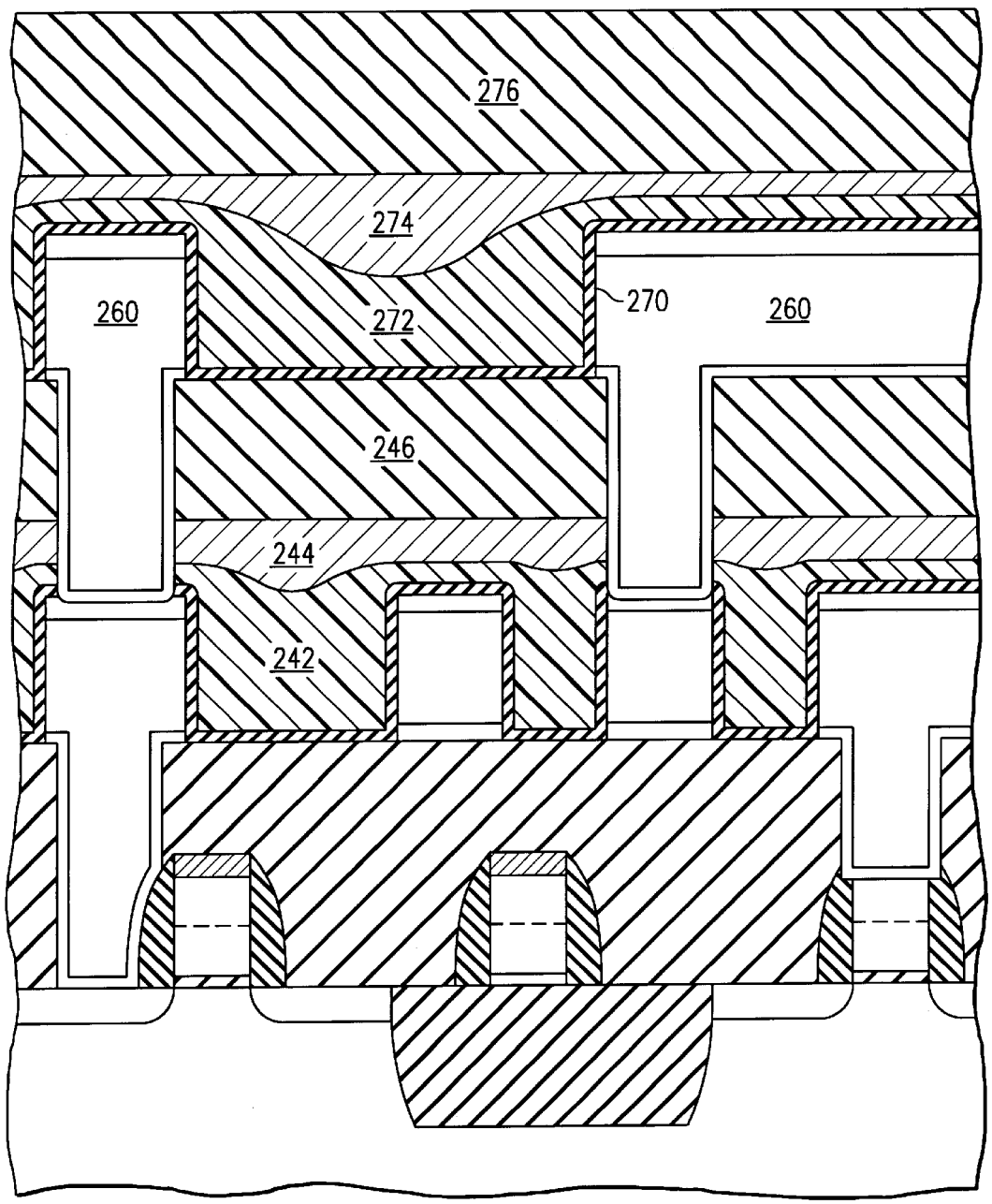
Figure 3A:
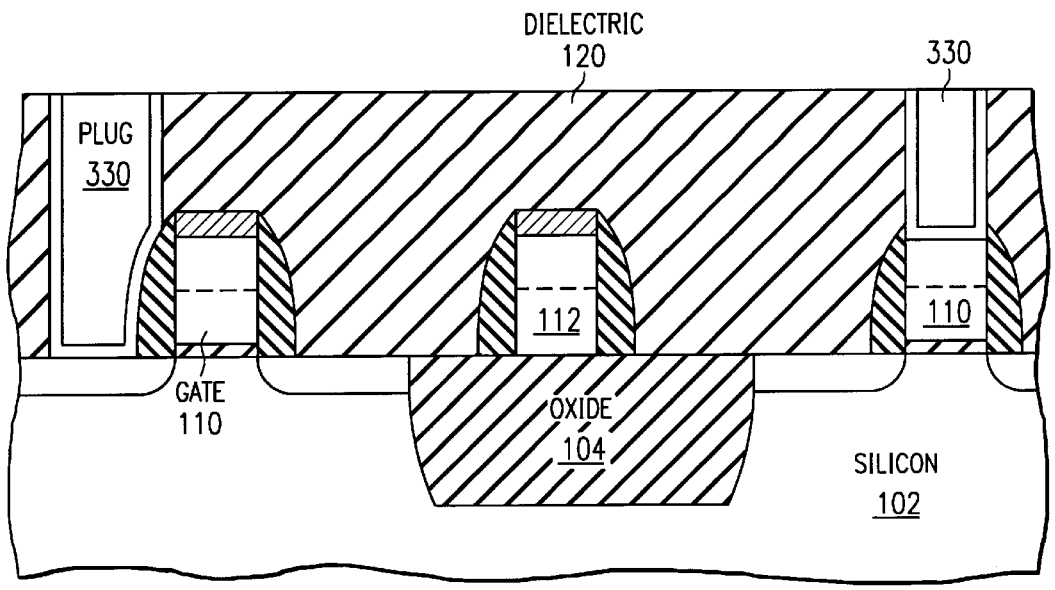
FIGS. 3a, b, c, d, e and f show in cross sectional elevation views a further preferred embodiment.

Of course, most of the via sidewall is oxide 246, so even poor adhesion to polymer 242 by the barrier layer does not present a problem. Interconnects 260 are patterned, liner 270 deposited, second level polymer 272 formed, HSQ adhesion layer 274 spun on, and capping oxide 276 deposited in the same manner as the corresponding components of the gapfill with etchback preferred embodiment previously described; see FIG. 2b Damascene A further preferred embodiment uses polymer dielectric in a damascene approach as illustrated in FIGS. 3a–f. In particular, begin with steps (1)–(4) of the gapfill preferred embodiments (FIGS. 1a–b), and in place of step (5) (patterning the blanket metal to form the first level interconnects) etchback the blanket metal to leave metal only in the vias; see FIG. 3a showing metal plugs 330 in the vias. The metal etchback may be, for example, by (isotropic) plasma etch (endpoint by loading drop) or by CMP. Alternatively, fill the vias by the same approach using doped polysilicon rather than metal: a blanket deposition of in situ doped polysilicon which fills the vias followed by an etchback to remove the polysilicon outside of the vias.

After via fill, pulsed plasma enhanced deposit polymer and process as in preceding gapfill preferred embodiment steps (7)–(8) to form 700 nm thick polymer layer 342.

Figure 3B:
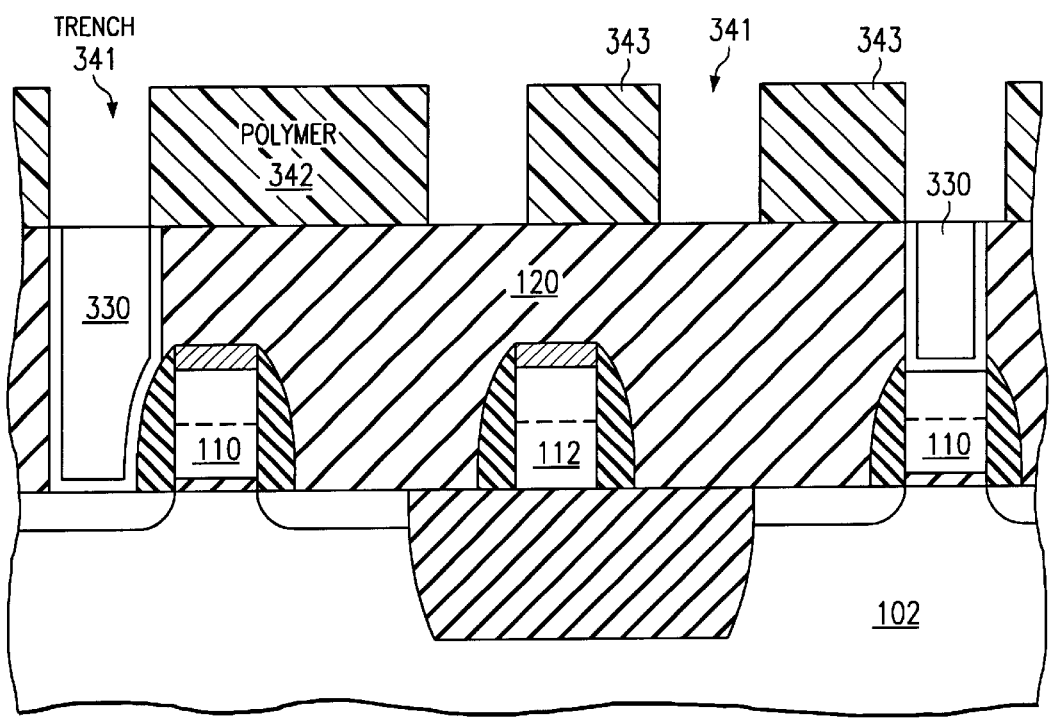
Figure 3C:
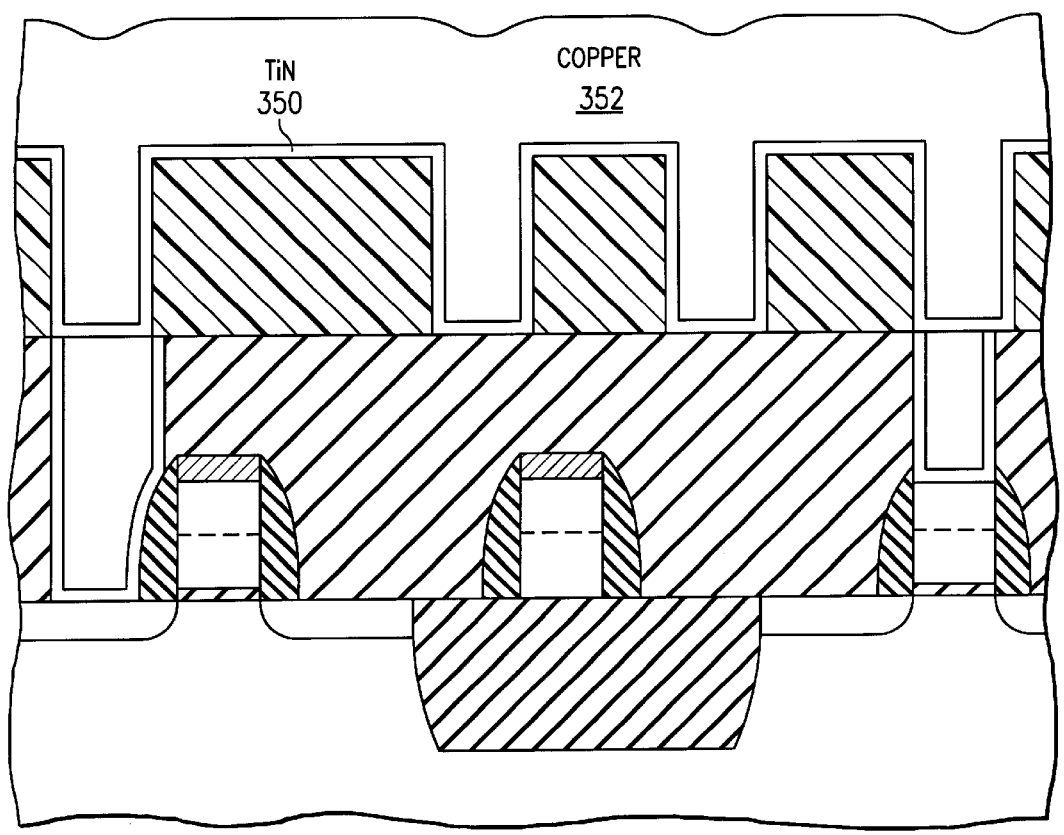

Next, photolithographically define the locations of interconnects and etch trenches 341 in the polymer down to dielectric 120 or plugs 330 at these locations; see FIG. 3b. The minimal spacing between adjacent trenches is about 200–300 nm, so the free-standing polymer strips 343 have an aspect ratio of roughly 3 to 1. The etch may be an anisotropic fluorine-oxygen-based plasma etch, such as CF4+CHF3+O2+Ar. Because the polymer may etch much faster than oxide, an overetch will not remove much of underlying dielectric 120 even if dielectric 120 is oxide. Alternatively, dielectric 120 could have a nitride upper portion to provide a more selective etchstop for the polymer trench etch.

Blanket deposit 20–50 nm thick TiN conformal barrier layer 350 by PVD or CVD. Other barrier materials include TaN, Ta2N, W2N and TiSiN (which can be formed by silane treatment of amorphous TiN). The surface of polymer 342 may not provide sufficient adhesion for the barrier layer, so activate the polymer surface by removing some fluorine atoms in a hydrogen-containing plasma. Also, CVD TiN provides better sidewall coverage than PVD, so use a CVD process such as ammonia plus tetrakisdimethylamino titanium (TDMAT).

Deposit (e.g., electroplating, CVD, PVD, or PVD seed layer followed by electroplating) 200 nm thick copper layer 352 on the TiN; this fills the interconnect trenches etched in the polymer 342 in the previous step plus covers the remainder of the wafer. See FIG. 3c.

Remove the portion of copper 352 outside of the interconnects by CMP; the CMP also planarizes any bumpiness in the plated copper. Alternatively, use a halogen plasma etch of copper, but these etches typically have fairly low etch rates because, for example, copper chloride tends to polymerize. CuCl can be removed with a strong Lewis acid such as triethylphosphine which reacts to form the gas ClCu (PEt3)2. Barrier layer 350 may also be a CMP polish stop; in this case the barrier must be etched off after the polishing. This CMP (or etching) leaves copper only as interconnect 352.

Figure 3D:
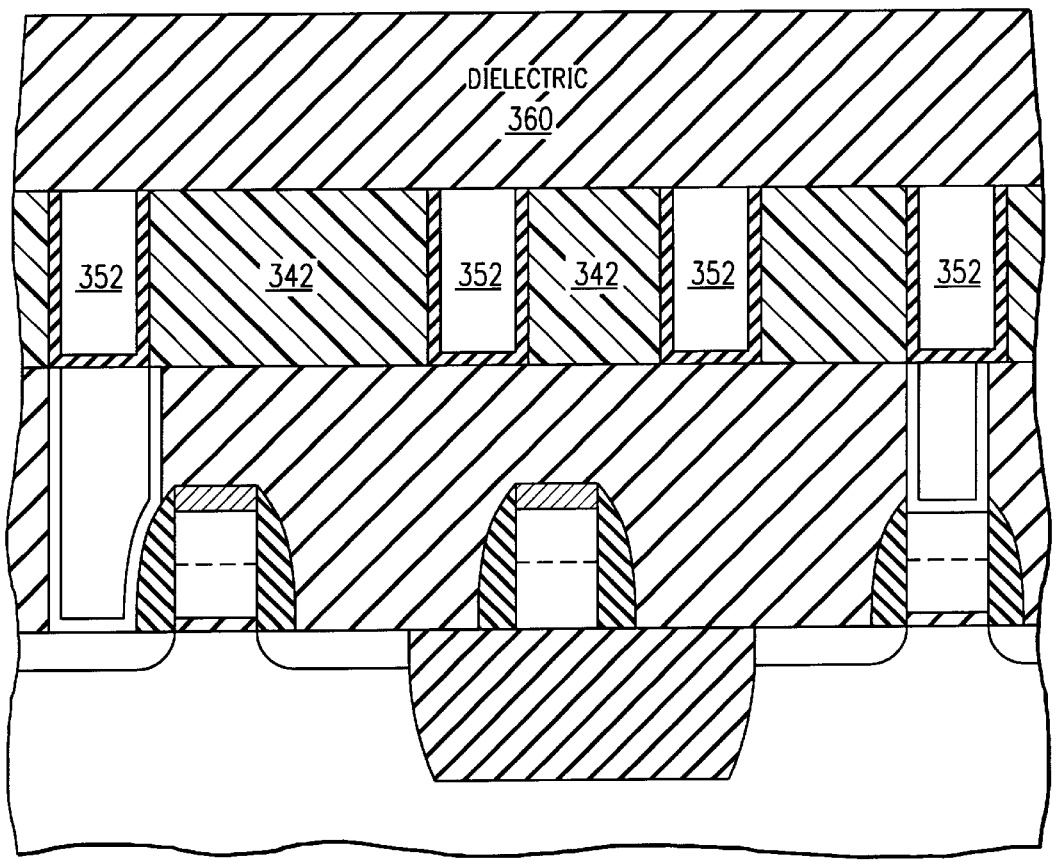
Figure 3E:
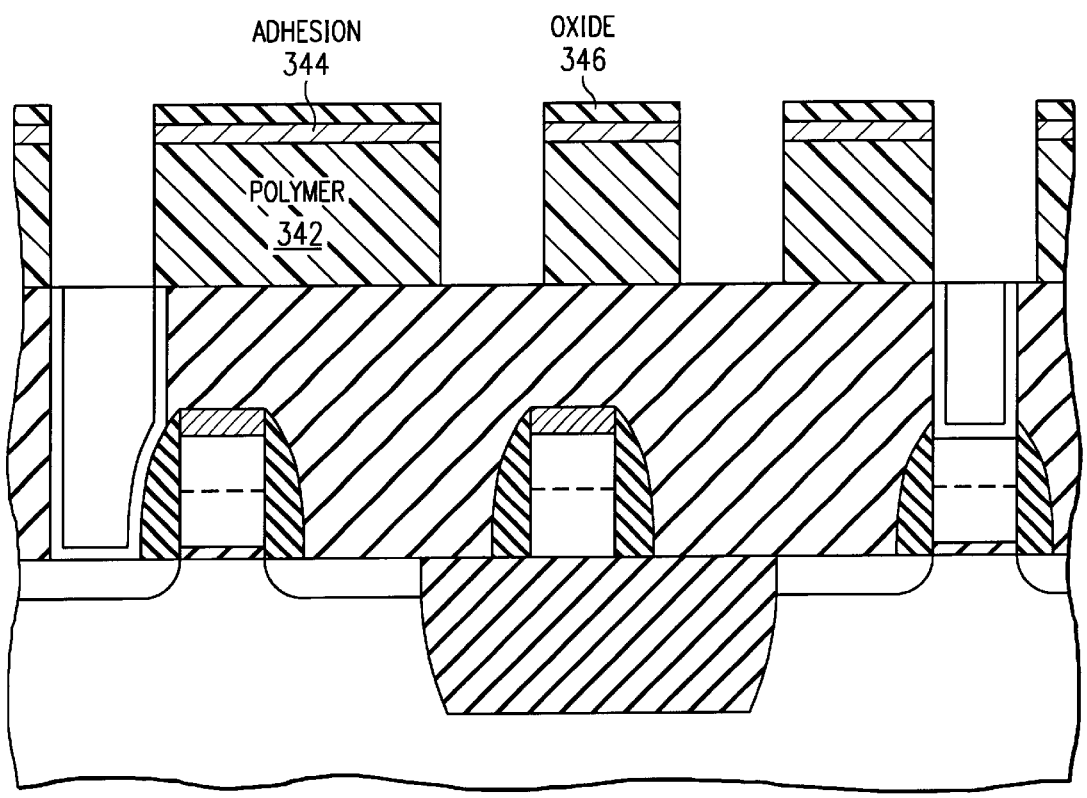
Figure 3F:
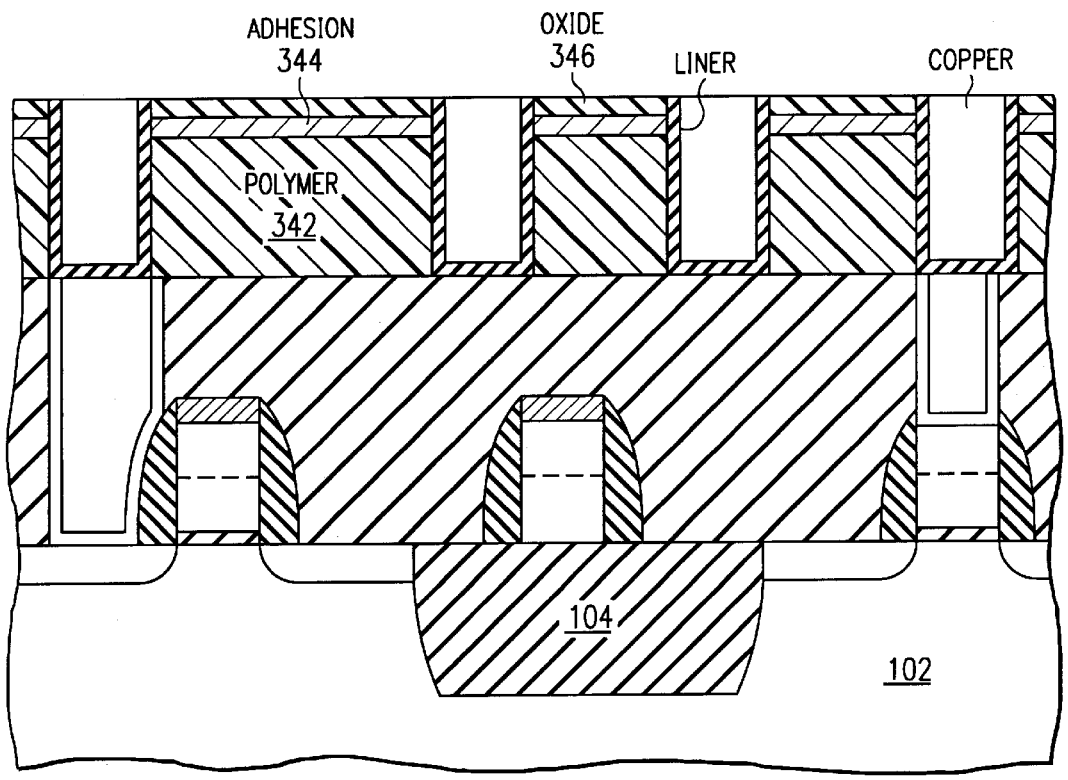

After the copper polishing, deposit 700 nm thick dielectric layer 360; see FIG. 3d. The dielectric may be oxide and deposited by plasma-enhanced TEOS decomposition with oxygen or ozone. This completes the first level interconnect (analogous to FIG. 1f), and repetition of the foregoing steps (via etch and fill, polymer deposition, trench etch, trench fill, and dielectric deposition) provides further interconnect levels.

An alternative structure for more protection of the polymer from CMP damage includes forming a 100 nm thick oxide layer 346 (on adhesion layer 344) on polymer 342 surface prior to interconnect trench etch. In this case the trenches are etched through both the oxide (plus adhesion layer) and the polymer; see FIG. 3e. Then follow the previously-described steps: barrier deposition, copper electroplating, and CMP to remove the copper outside of the interconnects. The CMP can remove a portion (or all) of the oxide plus adhesion layer, but the oxide (plus adhesion layer) protect the polymer from exposure to the CMP; see FIG. 3f. Of course, a thick adhesion layer which also provides good CMP properties could be used in place of a thin adhesion layer plus deposited oxide.

Further levels of interconnects can be made by repeating the steps of etch vias in the dielectric on the polymer plus top level interconnects, fill the vias, form polymer layer, pattern interconnects in the polymer, deposit blanket metal, polish to complete interconnects, and deposit overlying dielectric.

Also, a double damascene process could be used; this would etch the trenches and then vias in the trenches, and then fill both the vias and trenches at the same time.

Slot Geometry

Figure 4A:
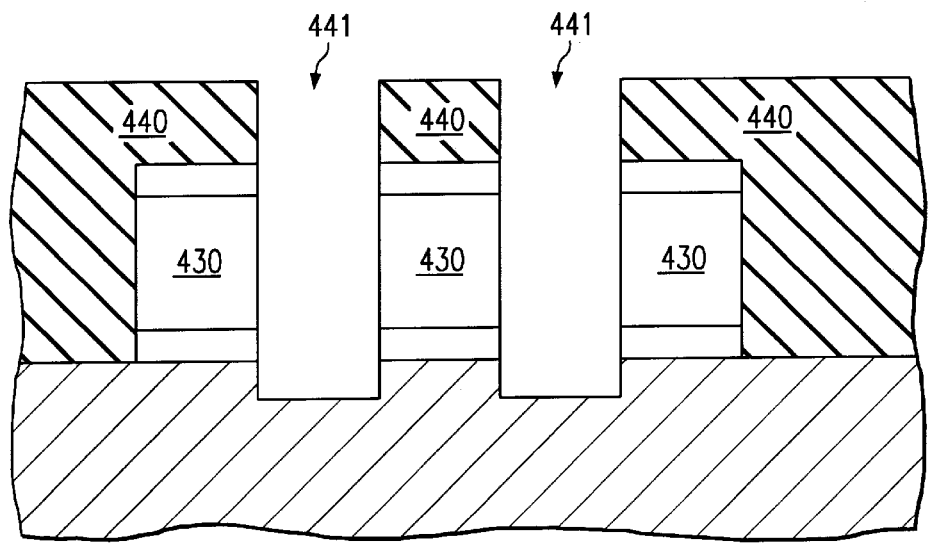
FIGS. 4a, b and c are cross sectional elevation views of another preferred embodiment.
Figure 4B:
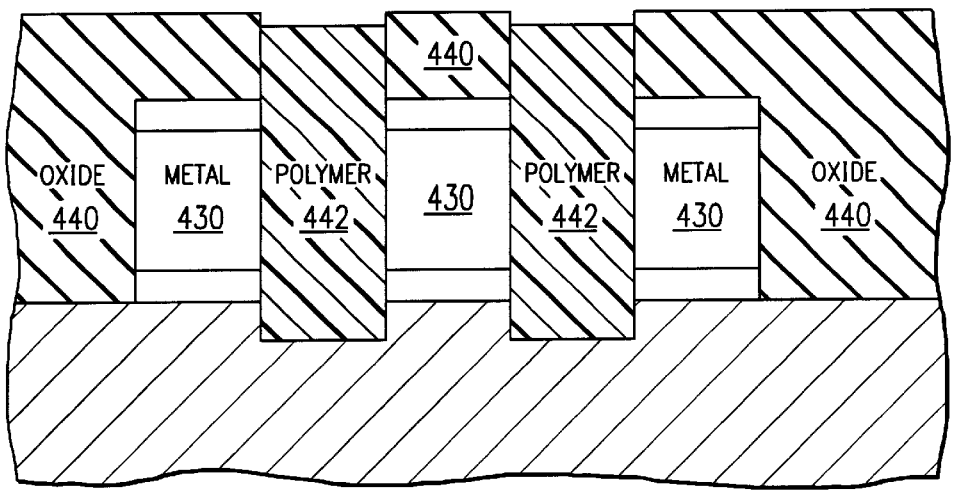
Figure 4C:
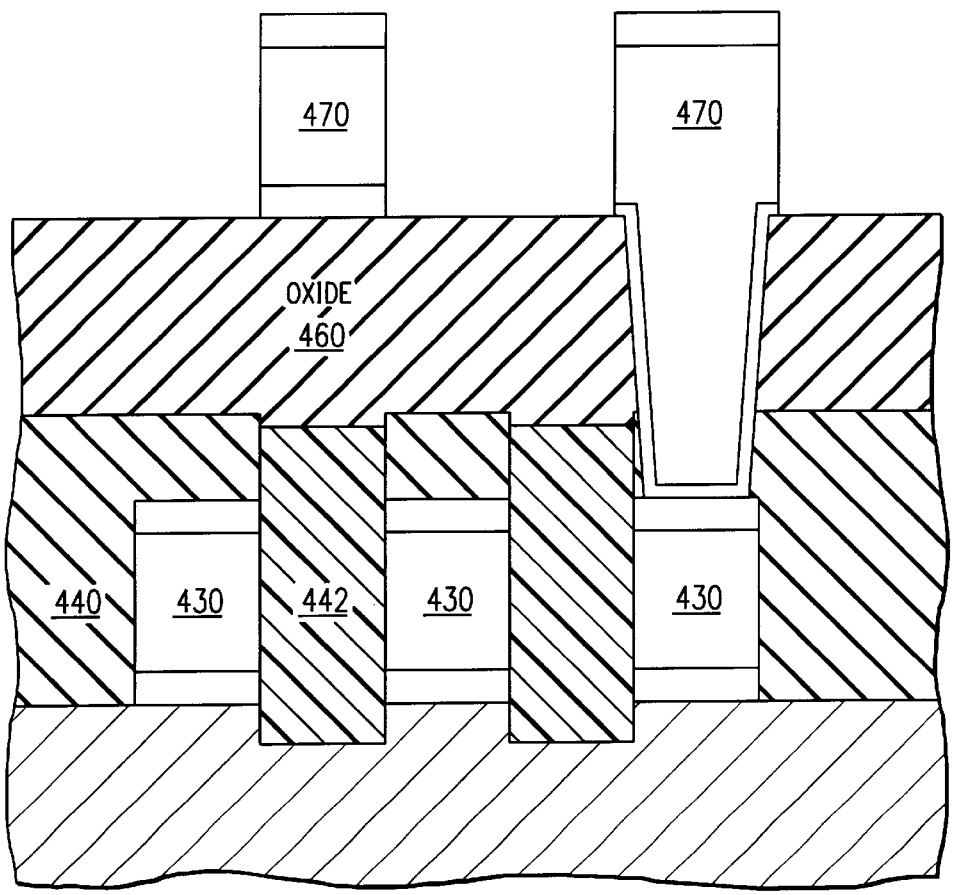

A further preferred embodiment deposits oxide over the interconnects, etches trenches between minimally spaced interconnects, and then fills the trenches with polymer by a pulse plasma deposition and etchback. In particular, FIGS. 4a–c illustrate this approach. FIG. 4a shows trenches 441 which have been etched in planarized oxide 440 and between minimally spaced adjacent interconnects 430. Again, interconnects 430 may be 700 nm high and 200 nm wide with the minimal spacing of 200 nm.

Next, pulse plasma deposit a polymer which fills trenches 441 plus the horizontal portions of oxide 440, and anneal to form polymer 442. Etchback polymer 442 (fluorine-oxygen-based plasma) to remove all of the polymer outside of the trenches; see FIG. 4b.

Deposit and planarize thick oxide 460 on oxide 440 and polymer 442, the poor adhesion to polymer 442 is not a problem because of the large oxide 440 area. Etch vias in oxide 460 down to interconnects 430, and deposit and pattern metal to form interconnects 470; see FIG. 4c. This approach only has polymer in minimal gaps between adjacent interconnects; of course, this is where the polymer has the most effect in lowering capacitive coupling.

Interconnects 430 could have a silicon nitride liner; this permits selective oxide etching the trenches in the minimal gaps between adjacent interconnects and leave the nitride liner to protect polymer 442 from metal interconnects 430. However, such a liner will increase the effective dielectric constant between the adjacent interconnects.

Modifications

The preferred embodiments can be modified in various ways while retaining the features of low power pulsed plasma deposition with gap filling or controlled voids, thermal stability annealing, and porosity.

In fact, the polymer could be polymerized from various precursors such as other monomers (e.g., fluoronated divinyl benzene, fluoronated styrene, fluorobenzonitrile, highly branched fluororalkenes, and so forth) or monomer mixtures (for copolymers). In fact, copolymers offer a number of additional possibilities in controlling the plasma deposition conditions and plasma dynamics. For example, the extent of polymer cross-linking could be varied by inclusion of small amounts of cross-linking agents (e.g., divinyl benzene or aliphatic dienes) in the precursor mixture.

Similarly, layer deposition rates, plasma compositions (and thus physical properties such as dielectric constants) could be controlled by judicious adjustment of precursor mixture compositions. In particular, inclusion of a less polymerizable monomer (e.g., a saturated compound) with a more readily polymerizable monomer (e.g., unsaturated compound) will enhance incorporation of monomers and low molecular weight loigomers in the growing (co)polymer layer. This, in turn, will enhance the porosity of the resultant layer after the annealing process to drive out the monomers and small oligomers.

The peak power density of the pulsed plasma and the ratio of on time to off time can be varied and will depend upon the precursors being used, but to fill narrow gaps the on time to off time ratio must be small enough so that approximately maximum polymer growth efficiency (growth per joule) obtains. Also, the pressure in the pulsed plasma reactor will affect growth rates and may require adjusting conditions.

Silicon based polymers or copolymers with carbon based monomers could be deposited with pulsed plasmas and provide alternatives to spin-on porous silica. For example, precursors cold include compounds such as TEOS. Likewise, the (co)polymers useful in biomedical apparatus and materials need not have low dielectric constants and other classes of precursors would be available for pulsed plasma depositions.

What is claimed is:

1. A method of forming a polymer on a surface, comprising the steps of:

(a) activating fluorocarbon precursors with a pulsed plasma;

(b) polymerizing said precursors to form a fluorocarbon polymer layer on a surface; and (c) annealing said polymer layer at a temperature of at least about 350 C.

2. The method of claim 1, wherein:

(a) said surface overlies integrated circuit devices.

3. A method of forming a porous polymer filling gaps on a surface, comprising the steps of:

(a) activating precursors with a pulsed plasma;

(b) polymerizing said precursors to form a polymer layer on a surface with gaps; and (c) annealing said polymer layer at a temperature of at least about 350 C. to yield a porous polymer within said gaps.

4. The method of claim 2, wherein:

(a) said surface overlies integrated circuit devices.

* * * * *